(12) United States Patent
Iida et al.

(10) Patent No.: US 9,136,285 B2
(45) Date of Patent: Sep. 15, 2015

(54) DISPLAY DEVICE, METHOD FOR DRIVING THE SAME, AND ELECTRONIC APPARATUS

(71) Applicant: Sony Corporation, Tokyo (JP)

(72) Inventors: Yukihito Iida, Kanagawa (JP); Mitsuru Asano, Kanagawa (JP); Katsuhide Uchino, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 187 days.

(21) Appl. No.: 13/926,655

(22) Filed: Jun. 25, 2013

(65) Prior Publication Data

US 2013/0320847 A1 Dec. 5, 2013

Related U.S. Application Data

(63) Continuation of application No. 12/632,330, filed on Dec. 7, 2009, now Pat. No. 8,570,245.

(30) Foreign Application Priority Data

Dec. 11, 2008 (JP) .................................. 2008-315467
Dec. 12, 2008 (JP) .................................. 2008-316551

(51) Int. Cl.
*G09G 3/30* (2006.01)
*H01L 27/12* (2006.01)
*G09G 3/32* (2006.01)
*H01L 27/32* (2006.01)

(52) U.S. Cl.
CPC .............. *H01L 27/124* (2013.01); *G09G 3/30* (2013.01); *G09G 3/3233* (2013.01); *H01L 27/3248* (2013.01); *G09G 2320/043* (2013.01); *G09G 2330/02* (2013.01); *G09G 2330/028* (2013.01); *G09G 2330/10* (2013.01)

(58) Field of Classification Search
None
See application file for complete search history.

(56) References Cited

U.S. PATENT DOCUMENTS 8,836,690 B2    9/2014  Minami et al.
2009/0179839 A1 7/2009  Yamashita et al.

FOREIGN PATENT DOCUMENTS

JP    2006-133542    5/2006
JP    2006-209089    8/2006

(Continued)

OTHER PUBLICATIONS

Japanese Office Action in connection with Japanese application No. 2008-316551 dated Jan. 22, 2013.

(Continued)

*Primary Examiner* — Nicholas Lee
(74) *Attorney, Agent, or Firm* — Dentons US LLP

(57) ABSTRACT

A display device including a pixel array unit having a matrix of pixels each configured such that an anode electrode of an organic electroluminescent element is connected to a source electrode of a drive transistor, a gate electrode of the drive transistor is connected to a source or drain electrode of a writing transistor, and a storage capacitor is connected between the gate and source electrodes of the drive transistor, scanning lines and power supply lines for individual pixel rows, and signal lines for individual pixel columns. A video signal reference potential is supplied to the signal lines for a period during which a scanning signal is supplied to the scanning lines during driving of pixels in a preceding row. During threshold correction for the drive transistor in a current pixel, the video signal reference potential and a potential of the cathode electrode of the organic electroluminescent element are equal.

15 Claims, 19 Drawing Sheets

(56) References Cited

FOREIGN PATENT DOCUMENTS

| | | |
|---|---|---|
| JP | 2007-101873 | 4/2007 |
| JP | 2007-316510 | 12/2007 |
| JP | 2008-040478 | 2/2008 |
| JP | 2008-058928 | 3/2008 |
| JP | 2008-107785 | 5/2008 |
| JP | 2008-185670 | 8/2008 |
| JP | 2008-249919 | 10/2008 |
| KR | 20080086371 | 9/2008 |

OTHER PUBLICATIONS

Korean Office Action corresponding to KR Serial No. 10-2009-0122222 dated May 17, 2015.

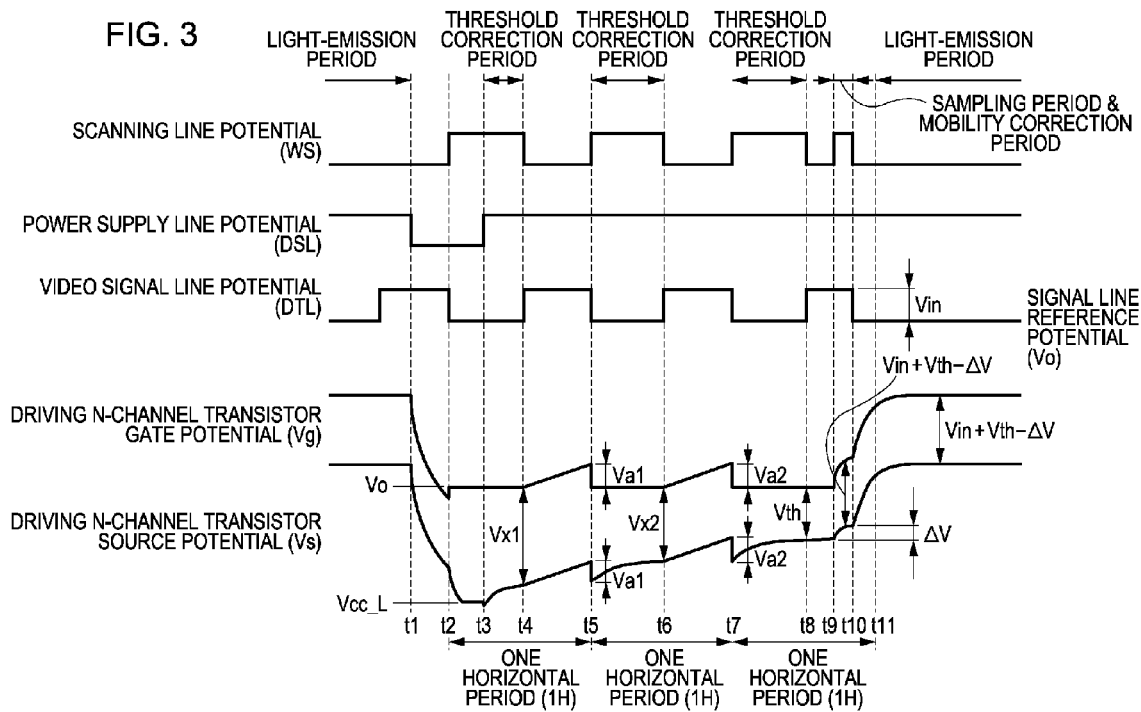

PRIOR TO t=t1 t=t1 t=t2 t=t3 t=t4 t=t5 t=t6 t=t7 t=t8 t=t9 t=t10

FIG. 17A
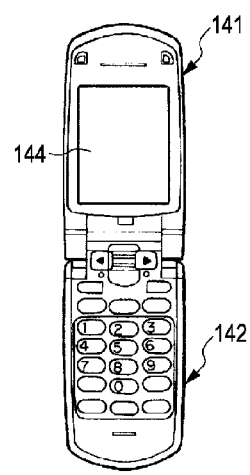
FIG. 17B
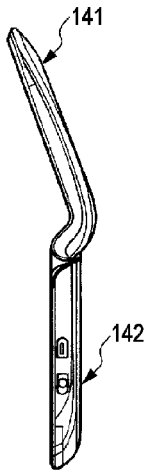
FIG. 17F
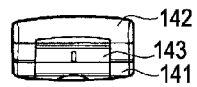
FIG. 17D    FIG. 17C    FIG. 17E
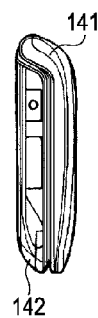 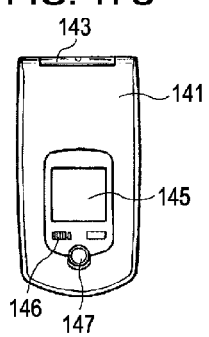 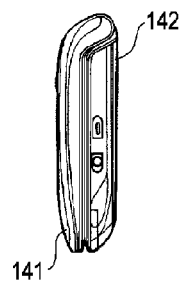
FIG. 17G
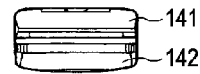

FIG. 18A

DSL 1B
p-Si
D1
D1
XVIIIB, XVIIIC
XVIIIB, XVIIIC
DTL
1J
1C
1A
WSL

FIG. 18B

D2
p-Si
M2
M1
1C    D1    1J    D1    GLASS SUBSTRATE

FIG. 18C

D2
p-Si(s)
M2
M1
1C    D1(g)    1J    D1(1H)    GLASS SUBSTRATE

DISPLAY DEVICE, METHOD FOR DRIVING THE SAME, AND ELECTRONIC APPARATUS

RELATED APPLICATION DATA

This application is a continuation of U.S. patent application Ser. No. 12/632,330 filed Dec. 7, 2009, the entirety of which is incorporated herein by reference to the extent permitted by law. The present application claims the benefit of priority to Japanese Patent Applications No. JP 2008-315467 filed on Dec. 11, 2008 and Japanese Patent Application No. JP 2008-316551 filed on Dec. 12, 2008 in the Japan Patent Office, the entireties of which are incorporated by reference herein to the extent permitted by law.

BACKGROUND OF THE INVENTION

1. Field of the Invention

The present invention relates to a display device, a method for driving the same, and an electronic apparatus. More specifically, the present invention relates to a planar (flat panel) display device having a matrix of pixels each including an electro-optical element, a method for driving the display device, and an electronic apparatus.

2. Description of the Related Art

In recent years, in the fields of display devices for displaying images, the prevalence of planar display devices having a matrix of pixels (pixel circuits) each including a light-emitting element has been rapidly increasing. Planar display devices, for example, organic electroluminescent (EL) display devices including organic EL elements that utilize a phenomenon in which the application of an electric field to an organic thin film induces light emission, have been developed and are being commercialized.

Since organic EL elements can be driven with an applied voltage of 10 V or less, power consumption is low. In addition, due to the self-emitting characteristics, organic EL elements do not use a light source (backlight) which is necessary for liquid crystal display devices. Furthermore, due to the response speed as high as about several of microseconds, organic EL elements cause no afterimages during the display of moving images.

As in liquid crystal display devices, organic EL display devices can use simple (passive) matrix and active matrix driving schemes. In recent years, the development of active-matrix display devices including pixel circuits having active elements, for example, insulated gate field effect transistors (in general, thin film transistors (TFTs)), has been greatly accelerated.

In general, it is common knowledge that the current-voltage characteristic (I-V characteristic) of organic EL elements deteriorates with time (called deterioration over time). Furthermore, a threshold voltage Vth of a drive transistor or the mobility $\mu$ of a semiconductor thin film forming a channel in the drive transistor (hereinafter referred to as the "mobility $\mu$ of the drive transistor") changes with time or differs from pixel to pixel due to the variations in the fabrication process.

Accordingly, in order to maintain the light emission luminance of organic EL elements at a constant level without suffering from the above influence, each of the pixel circuits is configured to have a function for compensating for characteristic changes in the organic EL elements, and also correction functions for correcting the change in the threshold voltage Vth of a drive transistor (hereinafter referred to as a "threshold correction") and correcting the change in the mobility $\mu$ of a drive transistor (hereinafter referred to as "mobility correction") (see, for example, Japanese Unexamined Patent Application Publication No. 2006-133542).

SUMMARY OF THE INVENTION

In the potential setting in a pixel circuit of the related art, however, a short between the gate and cathode of a driving transistor in a pixel causes non-light emission of a defective pixel. In addition, another problem occurs in that an area where luminance changes (hereinafter referred to as a "luminance change area") in several pixels before the transfer is perceived as a linear defect. In terms of visibility, the provision of a standard based on the number of non-light emitting pixels in the display area is not permitted for a change in luminance. In particular, for an increase in luminance, even one non-light emitting pixel is not permitted. Particular, if luminance increases in the display area, there is a problem in that a linear defect is perceived.

In a pixel circuit of the related art, furthermore, a storage capacitor and an auxiliary capacitor are arranged adjacent to each other, and wirings connected to those capacitors are provided in the same layer. There is a risk of the wirings in the same layer being shorted to each other during the fabrication process due to dust or the like thereon. A short between the wirings causes a short between the gate of the driving transistor and the cathode of the organic EL element, which are brought into conduction with the wirings. A short between the gate of the drive transistor and the cathode of the organic EL element involves problems in that a defective pixel where the short has occurred is not illuminated and a luminance change area in several pixels preceding in the transfer direction is perceived as a linear defect. In terms of visibility, the provision of a standard based on the number of non-light emitting pixels in the display area is not permitted for a change in luminance. In particular, for luminance increase, even one non-light emitting pixel is not permitted. Particular, if luminance increases in the display area, there is a problem in that a linear defect is perceived.

It is therefore desirable that even if the gate of a driving transistor and a cathode are electrically shorted to each other within a pixel, a luminance change area not be perceived as a linear defect although a defective pixel may not be illuminated.

It is also desirable to prevent an electric short from occurring between the gate electrode of a driving transistor and a cathode electrode so that due to the short, a non-light emitting pixel and a luminance change area may not be perceived as linear defects.

An embodiment of the present invention provides a display device including a pixel array unit having pixels arranged in a matrix, each pixel having a circuit configuration including an organic electroluminescent element, a drive transistor, a writing transistor, and a storage capacitor, wherein an anode electrode of the organic electroluminescent element is connected to a source electrode of the drive transistor, a gate electrode of the drive transistor is connected to a source electrode or drain electrode of the writing transistor, and the storage capacitor is connected between the gate and source electrodes of the drive transistor; scanning lines disposed for individual rows of the pixels in the pixel array unit and configured to supply a scanning signal to the gate electrodes of the writing transistors; power supply lines disposed for the individual rows of the pixels in the pixel array unit and configured to selectively supply a first potential and a second potential lower than the first potential to the drain electrodes of the drive transistors; and signal lines disposed for individual columns of the pixels in the pixel array unit and configured to selectively supply a video signal and a video signal reference potential to the drain electrodes or source electrodes of the writing transistors. The video signal reference potential is supplied to the signal lines for a period during which the scanning signal is supplied to the scanning lines during driving of pixels in a preceding row, and when threshold correction for the drive transistor in a current pixel is performed, the video signal reference potential and a potential of a cathode electrode of the organic electroluminescent element are equal to each other.

The embodiment of the present invention also provides a method for driving the display device, for setting the video signal reference potential and a potential of the cathode electrode of the organic electroluminescent element so as to have a same potential value.

The embodiment of the present invention also provides an electronic apparatus including the display device described above, which is provided in a housing of the electronic apparatus.

In the embodiment of the present invention, a video signal reference potential and a potential of a cathode electrode are set to have a same potential value, whereby even with the occurrence of an electrical short between the gate electrode of a driving transistor and a cathode electrode within a pixel, the reference potentials of pixels in the preceding pixel row can be made constant.

Another embodiment of the present invention provides a display device including a pixel array unit having pixels arranged in a matrix, each pixel having a circuit configuration including an electro-optical element, a drive transistor, a writing transistor, a storage capacitor, and an auxiliary capacitor, wherein a first electrode of the electro-optical element is connected to a source electrode of the drive transistor, a gate electrode of the drive transistor is connected to a source electrode or drain electrode of the writing transistor, the storage capacitor is connected between the gate and source electrodes of the drive transistor, and the auxiliary capacitor is connected between the first electrode of the electro-optical element and a second electrode of the electro-optical element. The storage capacitor and the auxiliary capacitor are arranged adjacent to each other. A wiring of the storage capacitor, which is brought into conduction with the gate electrode of the drive transistor, and a wiring of the auxiliary capacitor, which is brought into conduction with the second electrode of the electro-optical element, are provided in different layers.

The embodiment of the present invention also provides an electronic apparatus including the display device described above, which is provided in a housing of the electronic apparatus.

In the embodiment of the present invention, a wiring of a storage capacitor, which is brought into conduction with the gate electrode of a drive transistor, and a wiring of an auxiliary capacitor, which is brought into conduction with a second electrode of an electro-optical element, are provided in different layers. This can effectively avoid the occurrence of a short between the wirings.

An electro-optical element may be an organic EL element having a first electrode serving as an anode electrode and a second electrode serving as a cathode electrode. Wirings provided in different layers may be principal wirings that are disposed on a flat surface of a substrate and a flat surface of an insulating film on the substrate, and contacts and the like provided between the layers are not included.

According to an embodiment of the present invention, even if the gate and cathode of a driving transistor are electrically shorted to each other, a luminance change area can be prevented from being perceived as a linear defect although a defective pixel may not be illuminated.

According to another embodiment of the present invention, the occurrence of an electrical short between the gate electrode of a drive transistor and a second electrode of an electro-optical element can be effectively avoided. Therefore, a luminance change area can be prevented from being perceived as a linear defect although a defective pixel may not be illuminated.

BRIEF DESCRIPTION OF THE DRAWINGS

FIG. 3 is a timing waveform diagram illustrating the operation of the active-matrix organic EL display device according to the embodiment of the present invention;

FIGS. 17A to 17G are external views showing a mobile phone according to another application example of the present embodiment, in which FIGS. 17A and 17B are a front view and a side view of the mobile phone which is in its open state, respectively, and FIGS. 17C, 17D, 17E, 17F, and 17G are a front view, a left side view, a right side view, a top view, and a bottom view of the mobile phone which is in its closed state, respectively;

FIGS. 18A to 18C are diagrams illustrating a wiring structure of a pixel, in which FIG. 18A is a plan view of the pixel and FIGS. 18B and 18C are cross-sectional views taken along the lines XVIIIB-XVIIIB and XVIIIC-XVIIIC of FIG. 18A;

DESCRIPTION OF THE PREFERRED EMBODIMENTS

An embodiment of the present invention will now be described. The description will be given in the following order:

1. Display Device according to Present Embodiment (System Configuration, Pixel Circuit, and Circuit Operation)
2. Problems Caused by Short between Gate of Drive Transistor and Cathode (Equivalent Circuit and Timing Waveform Diagram)
3. Example Configuration according to Present Embodiment (Pixel Circuit, System Configuration, and Driving Method)
4. Application Examples (Various Examples of Application in Electronic Apparatuses)
5. Example Configuration according to Present Embodiment (Pixel Circuit, System Configuration, Wiring Structure, and Driving Method)

1. Display Device According to Present Embodiment

System Configuration

Figure 1:
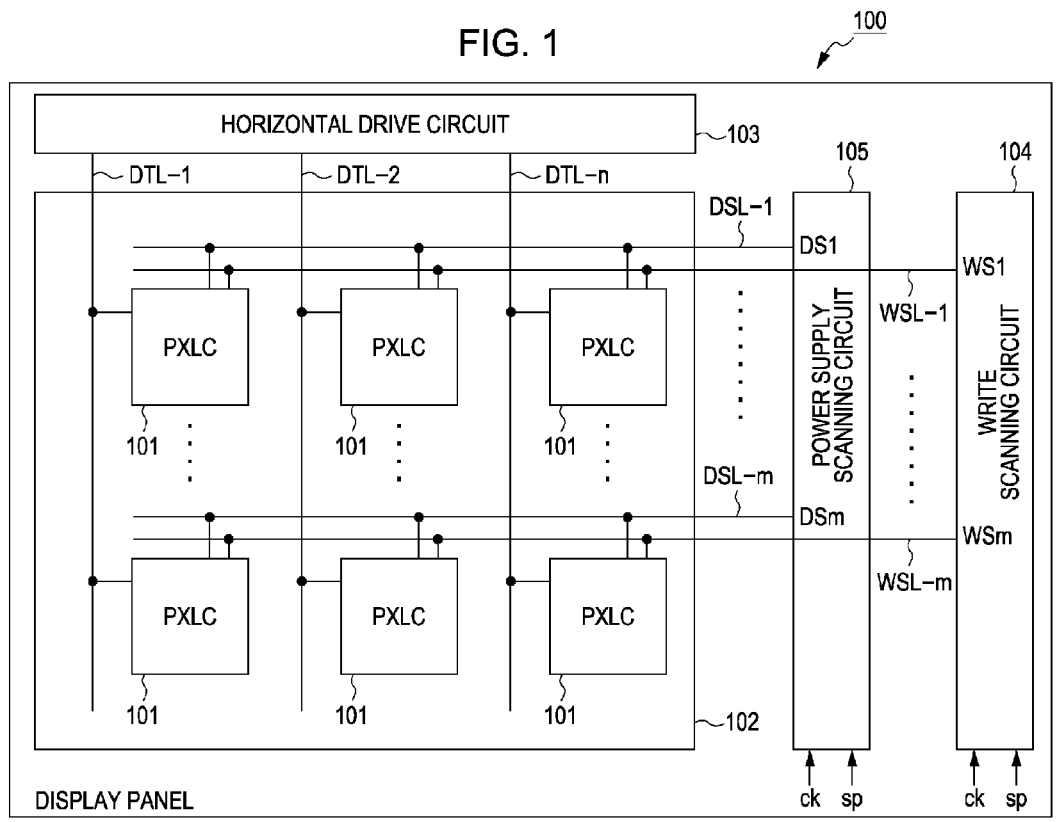
FIG. 1 is a system configuration diagram schematically showing the configuration of an active-matrix organic EL display device according to an embodiment of the present invention.

FIG. 1 is a system configuration diagram schematically showing the configuration of an active-matrix display device according to the present embodiment.

A description will now be given of a current-driven electro-optical element whose light emission luminance changes in accordance with a current value of a current flowing in the device, for example, an active-matrix organic EL display device in which an organic EL element is used as a light-emitting element of a pixel (pixel circuit), by way of example.

As shown in FIG. 1, an organic EL display device 100 is configured to include a pixel array unit 102 having pixels (PXLC) 101 arranged in a two-dimensional matrix, and a driving unit arranged around the pixel array unit 102 to drive the pixels 101. The driving unit for driving the pixels 101 includes, for example, a horizontal drive circuit 103, a write scanning circuit 104, and a power supply scanning circuit 105.

The pixel array unit 102 has scanning lines WSL-1 to WSL-m, power supply lines DSL-1 to DSL-m, and signal lines DTL-1 to DTL-n for the m-row n-column pixel array. The scanning lines WSL-1 to WSL-m and the power supply lines DSL-1 to DSL-m are disposed for the individual rows, and the signal lines DTL-1 to DTL-n are disposed for the individual pixel columns.

The pixel array unit 102 is typically defined on a transparent insulating substrate such as a glass substrate, and has a planar (flat) panel structure. Each of the pixels 101 in the pixel array unit 102 can be formed using an amorphous silicon thin film transistor (TFT) or a low-temperature polysilicon TFT. In a case where low-temperature polysilicon TFTs are used, the horizontal drive circuit 103, the write scanning circuit 104, and the power supply scanning circuit 105 can also be mounted on the display panel (substrate) on which the pixel array unit 102 is defined.

The write scanning circuit 104 may be formed of a shift register for sequentially shifting (transferring) a start pulse sp in synchronization with a clock pulse ck, or any other suitable device. In order to write a video signal in the pixels 101 in the pixel array unit 102, the write scanning circuit 104 sequentially supplies write pulses (scanning signals) WS1 to WSm to the scanning lines WSL-1 to WSL-m. Accordingly, the pixels 101 in the pixel array unit 102 are scanned in row-by-row order (line sequentially scanned).

The power supply scanning circuit 105 may be formed of a shift register for sequentially shifting the start pulse sp in synchronization with the clock pulse ck, or any other suitable device. In synchronization with line sequentially scanning performed by the write scanning circuit 104, the power supply scanning circuit 105 selectively supplies power supply line potentials DS1 to DSm, which are switched between a first potential Vcc_H and a second potential Vcc_L lower than the first potential Vcc_H, to the power supply lines DSL-1 to DSL-m. Accordingly, light emission/non-light emission of the pixels 101 can be controlled.

The horizontal drive circuit 103 appropriately selects one of a signal voltage Vsig of a video signal corresponding to luminance information, which is supplied from a signal supply source (not shown) (hereinafter also referred to simply as a "signal voltage"), and a signal line reference potential Vo, and writes the selected one in the pixels 101 in the pixel array unit 102 via the signal lines DTL-1 to DTL-n, for example, on a row-by-row basis. In other words, the horizontal drive circuit 103 adopts a line sequential write drive mode in which a signal voltage Vin of a video signal is written row by row (line by line).

The signal line reference potential Vo is a voltage (for example, a voltage corresponding to black level) which the signal voltage Vin of the video signal is based on. Further, the second potential Vcc_L is set to a potential lower than the signal line reference potential Vo, for example, a potential lower than a potential Vo-Vth where Vth denotes the threshold voltage of a drive transistor, preferably, a potential sufficiently lower than the potential Vo-Vth.

Pixel Circuit

Figure 2:
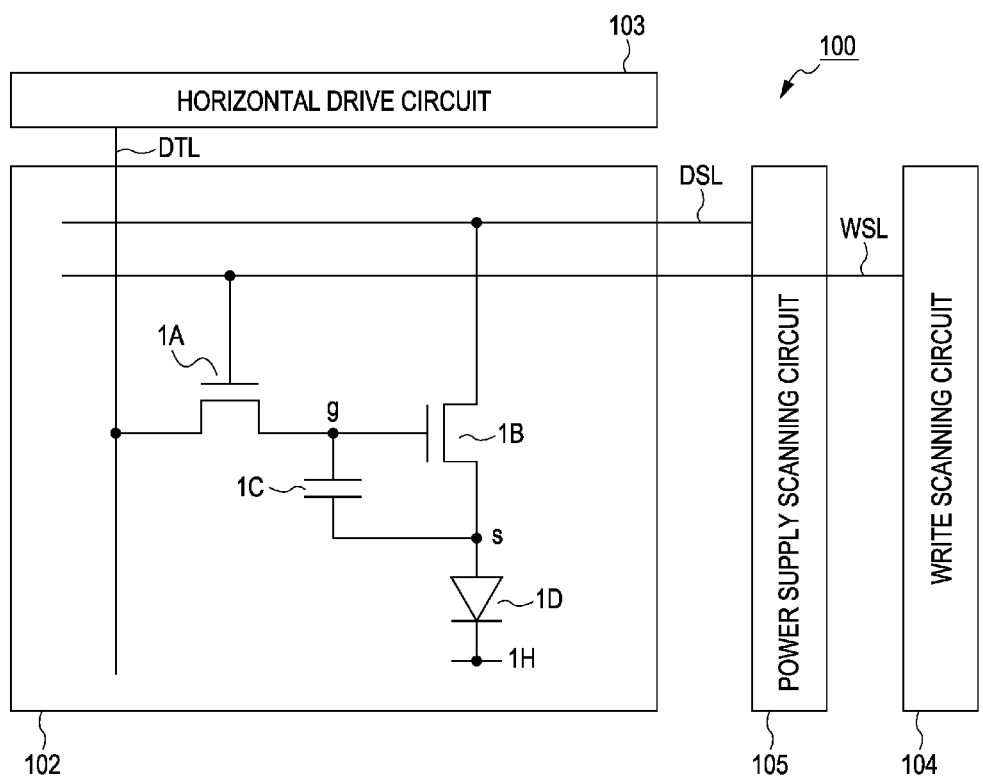
FIG. 2 is a circuit diagram showing a specific example configuration of a pixel (pixel circuit)

FIG. 2 is a circuit diagram showing a specific example configuration of each of the pixels (pixel circuits) 101.

As shown in FIG. 2, the pixel 101 has a current-driven electro-optical element whose light emission luminance changes in accordance with a current value of a current flowing in the device, for example, an organic EL element 1D, as a light-emitting element. The pixel 101 has a pixel configuration including, in addition to the organic EL element 1D, a drive transistor 1B, a writing transistor 1A, and a storage capacitor 1C, that is, a 2Tr/1C pixel configuration having two transistors (Tr) and one capacitor (C).

In the pixel 101 having the above configuration, each of the drive transistor 1B and the writing transistor 1A is implemented using an N-channel TFT. However, the conductor combination of transistors used herein, namely, the drive transistor 1B and the writing transistor 1A, is merely an example, and any other combination of transistors may be employed.

The organic EL element 1D has a cathode electrode connected to a common power supply line 1H that is commonly disposed for all the pixels 101. The drive transistor 1B has a source electrode connected to an anode electrode of the organic EL element 1D, and a drain electrode connected to the power supply line DSL (DSL-1 to DSL-m).

The writing transistor 1A has a gate electrode connected to the scanning line WSL (WSL-1 to WSL-m), one electrode (source electrode or drain electrode) connected to the signal line DTL (DTL-1 to DTL-n), and the other electrode (drain electrode or source electrode) connected to a gate electrode of the drive transistor 1B.

The storage capacitor 1C has one electrode connected to the gate electrode of the drive transistor 1B, and the other electrode connected to the source electrode of the drive transistor 1B (the anode electrode of the organic EL element 1D).

In the pixel 101 having a 2Tr/1C pixel configuration, the writing transistor 1A is brought into a conducting state in response to a scanning signal WS applied to the gate electrode from the write scanning circuit 104 via the scanning line WSL. Thus, the signal voltage Vin of the video signal corresponding to the luminance information, which is supplied from the horizontal drive circuit 103 via the signal line DTL, or the signal line reference potential Vo is sampled and written in the pixel 101.

The written signal voltage Vin or signal line reference potential Vo is applied to the gate electrode of the drive transistor 1B and is also stored in the storage capacitor 1C. When the potential DS of the power supply line DSL (DSL-1 to DSL-m) is set to the first potential Vcc_H, the drive transistor 1B is supplied with a current from the power supply line DSL and supplies a driving current of the current value corresponding to the voltage value of the signal voltage Vin stored in the storage capacitor 1C to the organic EL element 1D to drive the organic EL element 1D to emit light.

Circuit Operation of Organic EL Display Device

Next, the circuit operation of the organic EL display device 100 having the above configuration will be described with reference to a timing waveform diagram shown in FIG. 3 and operation-explaining diagrams shown in FIGS. 4A to FIG. 6C. In the operation-explaining diagrams shown in FIGS. 4A to 6C, for simplicity of illustration, the writing transistor 1A is represented by the symbol of switch. Since the organic EL element 1D has a capacitive component, an EL capacitor 1I is also illustrated.

The timing waveform diagram shown in FIG. 3 illustrates changes in the potential (write pulse) WS of the scanning line WSL (WSL-1 to WSL-m), changes in the potential DS (Vcc_H or Vcc_L) of the power supply line DSL (DSL-1 to DSL-m), and changes in gate potential Vg and source potential Vs of the drive transistor 1B.

(Light-Emission Period)

In the timing waveform diagram shown in FIG. 3, the organic EL element 1D is in a light emitting state prior to time t1 (light-emission period). In the light-emission period, the potential DS of the power supply line DSL is set to the first potential Vcc_H and the writing transistor 1A is in a non-conducting state.

Figure 4A:
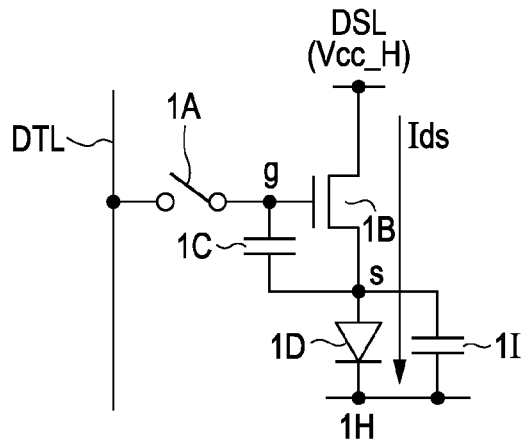
FIGS. 4A to 4D are diagrams (first part) illustrating the circuit operation of the active-matrix organic EL display device according to the embodiment of the present invention.

During this period, the drive transistor 1B is set so as to operate in the saturation region. Thus, as shown in FIG. 4A, a driving current (drain-source current) Ids corresponding to a gate-source voltage Vgs of the drive transistor 1B is supplied to the organic EL element 1D from the power supply line DSL through the drive transistor 1B. Therefore, the organic EL element 1D emits light with a luminance corresponding to the current value of the driving current Ids.

(Threshold Correction Preparation Period)

Figure 4B:
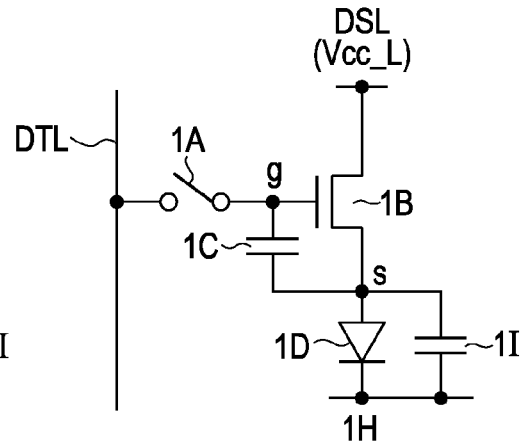

A new field of line sequentially scanning begins at time t1. As shown in FIG. 4B, the potential DS of the power supply line DSL is switched from the first potential (hereinafter referred to as a "high potential") Vcc_H to the second potential (hereinafter referred to as a "low potential") Vcc_L sufficiently lower than the signal line reference potential Vo-Vth of the signal line DTL.

Here, the organic EL element 1D has a threshold voltage Vel and the common power supply line 1H has a potential Vcath. If the low potential Vcc_L satisfies condition Vcc_L<Vel+Vcath, then, the source potential Vs of the drive transistor 1B is substantially equal to the low potential Vcc_L. Thus, the organic EL element 1D enters the reverse biased state and light is extinguished.

Figure 4C:
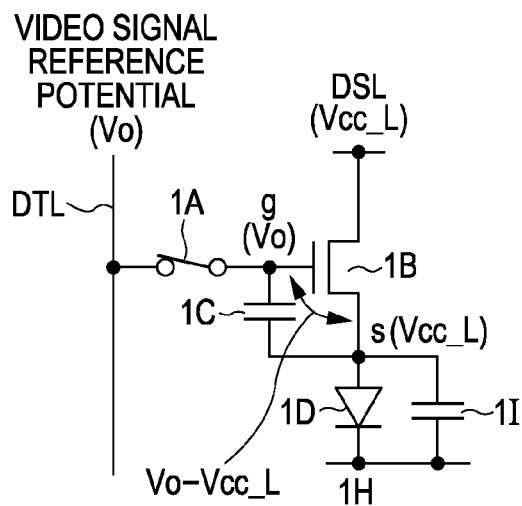

Then, at time t2, a transition of the potential WS of the scanning line WSL from the low-potential side to the high-potential side brings the writing transistor 1A into the conducting state, as shown in FIG. 4C. At this time, since the signal line reference potential Vo is supplied from the horizontal drive circuit 103 to the signal line DTL, the gate potential Vg of the drive transistor 1B is set to the signal line reference potential Vo. Further, the source potential Vs of the drive transistor 1B is set to the potential Vcc_L, which is sufficiently lower than the signal line reference potential Vo.

At this time, the gate-source voltage Vgs of the drive transistor 1B is set to a potential Vo-Vcc_L. Here, it is necessary to establish potential relationship Vo-Vcc_L>Vth because the threshold correction operation described below is not performed unless the potential Vo-Vcc_L is greater than the threshold voltage Vth of the drive transistor 1B. Accordingly, an operation of performing initialization with the gate potential Vg of the drive transistor 1B fixed (set) to the signal line reference potential Vo and the source potential Vs to the low potential Vcc_L is an operation for preparing threshold correction.

(First Threshold Correction Period)

Figure 4D:
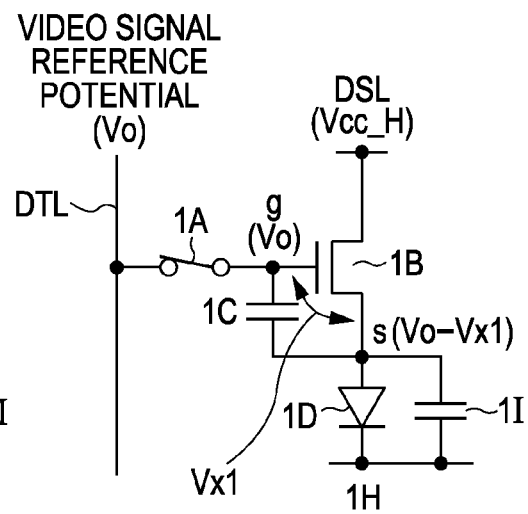

Then, at time t3, as shown in FIG. 4D, the potential DS of the power supply line DSL is switched from the low potential Vcc_L to the high potential Vcc_H. Then, the source potential Vs of the drive transistor 1B starts to increase, and a first threshold correction period begins. The increase in the source potential Vs of the drive transistor 1B during the first threshold correction period allows the gate-source voltage Vgs of the drive transistor 1B to have a predetermined potential Vx1. The potential Vx1 is stored in the storage capacitor 1C.

Figure 5A:
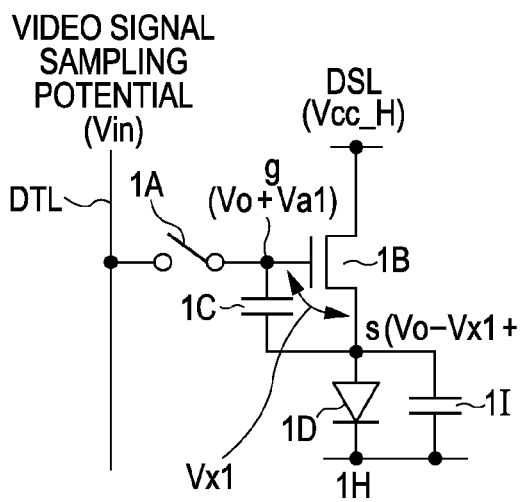
FIGS. 5A to 5D are diagrams (second part) illustrating the circuit operation of the active-matrix organic EL display device according to the embodiment of the present invention.

Subsequently, at time t4 with which the second half of this horizontal period (1H) begins, as shown in FIG. 5A, the signal voltage Vin of the video signal is supplied from the horizontal drive circuit 103 to the signal line DTL, thus causing a transition of the potential of the signal line DTL from the signal line reference potential Vo to the signal voltage Vin. During this period, the signal voltage Vin is written in pixels in another row.

At this time, in order to prevent the signal voltage Vin from being written in pixels in the current row, a transition of the potential WS of the scanning line WSL from the high-potential side to the low-potential side brings the writing transistor 1A into the non-conducting state. Thus, the gate electrode of the drive transistor 1B is separated from the signal line DTL and becomes floating.

When the gate electrode of the drive transistor 1B is floating, because of the storage capacitor 1C connected between the gate and the source of the drive transistor 1B, if the source potential Vs of the drive transistor 1B changes, the gate potential Vg of the drive transistor 1B also changes in accordance with (or following) the change in the source potential Vs. This is called a bootstrap operation based on the storage capacitor 1C.

Even after time t4, the source potential Vs of the drive transistor 1B continues increasing and finally increases by Va1 (Vs=Vo−Vx1+Va1). At this time, due to the bootstrap operation, the gate potential Vg of the drive transistor 1B also increases by Va1 (Vg=Vo+Va1) in accordance with the increase in the source potential Vs.

(Second Threshold Correction Period)

Figure 5B:
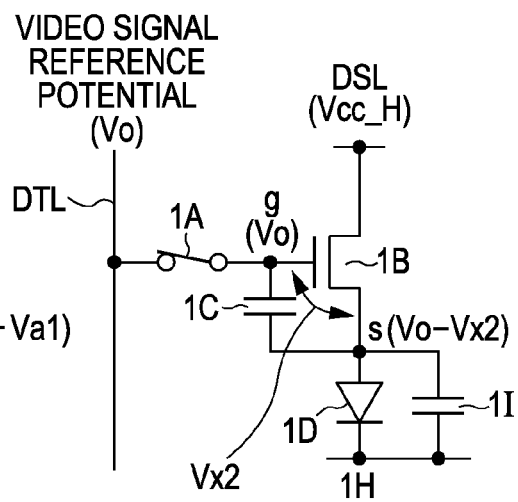

At time t5, the next horizontal period begins, and, as shown in FIG. 5B, a transition of the potential WS of the scanning line WSL from the low-potential side to the high-potential side brings the writing transistor 1A into the conducting state. At the same time, the signal line reference potential Vo instead of the signal voltage Vin is supplied from the horizontal drive circuit 103 to the signal line DTL, and a second threshold correction period begins.

During the second threshold correction period, since the writing transistor 1A is brought into the conducting state, the signal line reference potential Vo is written. Thus, the gate potential Vg of the drive transistor 1B is initialized again to the signal line reference potential Vo. At this time, in accordance with the drop of the gate potential Vg, the source potential Vs also decreases. Then, the source potential Vs of the drive transistor 1B again starts to increase.

Then, the increase in the source potential Vs of the drive transistor 1B during the second threshold correction period allows the gate-source voltage Vgs of the drive transistor 1B to have a predetermined potential Vx2. The potential Vx2 is stored in the storage capacitor 1C.

Figure 5C:
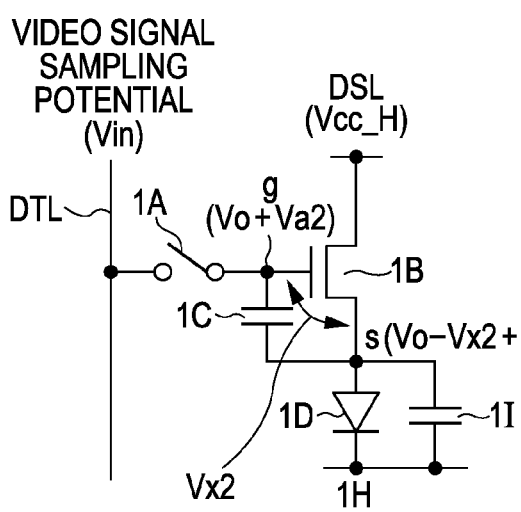

Subsequently, at time t6 with which the second half of this horizontal period (1H) begins, as shown in FIG. 5C, the signal voltage Vin of the video signal is supplied from the horizontal drive circuit 103 to the signal line DTL, thus causing a transition of the potential of the signal line DTL from the offset voltage Vo to the signal voltage Vin. During this period, the signal voltage Vin is written in pixels in another row (row subsequent to the row where the previous writing has been performed).

At this time, in order to prevent the signal voltage Vin in pixels from being written in the current row, a transition of the potential WS of the scanning line WSL from the high-potential side to the low-potential side brings the writing transistor 1A into the non-conducting state. Thus, the gate electrode of the drive transistor 1B is separated from the signal line DTL and becomes floating.

Even after time t6, the source potential Vs of the drive transistor 1B continues increasing and finally increases by Va2 (Vs=Vo−Vx1+Va2). At this time, due to the bootstrap operation, the gate potential Vg of the drive transistor 1B also increases by Va2 (Vg=Vo+Va2) in accordance with the increase in the source potential Vs.

(Third Threshold Correction Period)

Figure 5D:
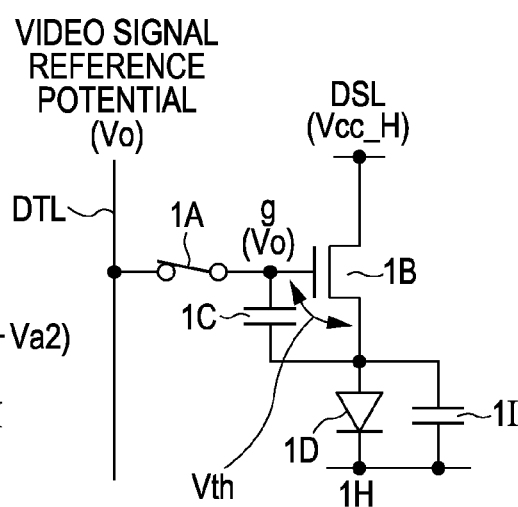

At time t7, the next horizontal period begins, and, as shown in FIG. 5D, a transition of the potential WS of the scanning line WSL from the low-potential side to the high-potential side brings the writing transistor 1A into the conducting state. At the same time, the signal line reference potential Vo instead of the signal voltage Vin is supplied from the horizontal drive circuit 103 to the signal line DTL, and a third threshold correction period begins.

During the third threshold correction period, since the writing transistor 1A is brought into the conducting state, the signal line reference potential Vo is written. Thus, the gate potential Vg of the drive transistor 1B is initialized again to the signal line reference potential Vo. At this time, in accordance with the drop of the gate potential Vg, the source potential Vs also decreases. Then, the source potential Vs of the drive transistor 1B again starts to increase.

The increase in the source potential Vs of the drive transistor 1B allows the gate-source voltage Vgs of the drive transistor 1B to converge to the threshold voltage Vth of the drive transistor 1B. Thus, the voltage corresponding to the threshold voltage Vth is stored in the storage capacitor 1C.

The threshold correction operation performed three times as described above allows the detection of the threshold voltage Vth of the drive transistor 1B of each of the pixel and the storage of the voltage corresponding to the threshold voltage Vth in the storage capacitor 1C. In order to prevent a current from flowing in the organic EL element 1D while causing a current to flow in the storage capacitor 1C during the three threshold correction periods, the potential Vcath of the common power supply line 1H is set so that the organic EL element 1D can be rendered into a cut-off state.

(Signal Writing Period & Mobility Correction Period)

Figure 6A:
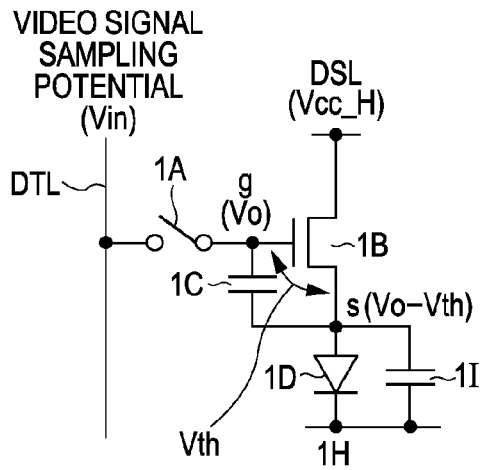
FIGS. 6A to 6C are diagrams (third part) illustrating the circuit operation of the active-matrix organic EL display device according to the embodiment of the present invention.

Then, at time t8, a transition of the potential WS of the scanning line WSL to the low-potential side brings the writing transistor 1A into the non-conducting state, as shown in FIG. 6A. At the same time, the potential of the signal line DTL is switched from the offset voltage Vo to the signal voltage Vin of the video signal.

Since the writing transistor 1A is brought into the non-conducting state, the gate electrode of the drive transistor 1B becomes floating. However, the gate-source voltage Vgs is equal to the threshold voltage Vth of the drive transistor 1B and therefore the drive transistor 1B is rendered into a cut-off state. Thus, the drain-source current Ids does not flow in the drive transistor 1B.

Figure 6B:
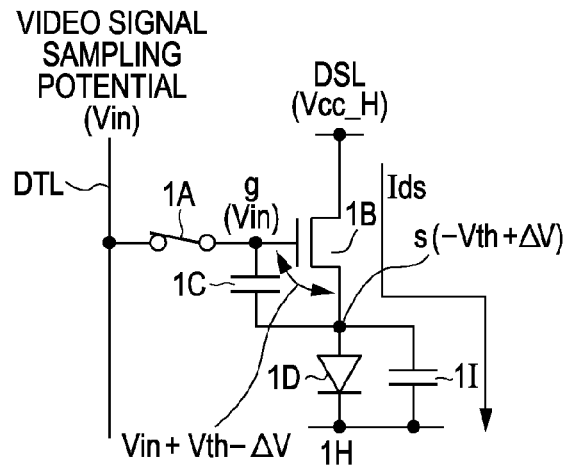

Subsequently, at time t9, a transition of the potential WS of the scanning line WSL to the high-potential side brings the writing transistor 1A into the conducting state, as shown in FIG. 6B. Thus, the signal voltage Vin of the video signal is sampled and written in the pixel 101. The writing of the signal voltage Vin by the writing transistor 1A allows the gate potential Vg of the drive transistor 1B to increase by the signal voltage Vin.

Then, when the drive transistor 1B is driven by the signal voltage Vin of the video signal, the threshold voltage Vth of the drive transistor 1B is canceled out with the voltage corresponding to the threshold voltage Vth stored in the storage capacitor 1C, thereby performing threshold correction. A principle of threshold correction will be described below.

At this time, since the organic EL element 1D is initially in the cut-off state (high-impedance state), the current (drain-source current Ids), which flows in the drive transistor 1B from the power supply line DSL in accordance with the signal voltage Vin of the video signal, flows in the EL capacitor 1I of the organic EL element 1D. Therefore, the charging of the EL capacitor 1I is started.

Due to the charging of the EL capacitor 1I, the source potential Vs of the drive transistor 1B increases with time. Since the variation of the threshold voltage Vth of the drive transistor 1B has already been corrected (threshold correction) at this time, the drain-source current Ids in the drive transistor 1B depends on the mobility $\mu$ of the drive transistor 1B.

Afterwards, when the source potential Vs of the drive transistor 1B increases up to a potential Vo−Vth+ΔV, the gate-source voltage Vgs of the drive transistor 1B is given by Vin+Vth−ΔV. That is, the amount of increase of the source potential Vs, ΔV, is subtracted from the voltage stored in the storage capacitor 1C (Vin+Vth−ΔV), in other words, the charge in the storage capacitor 1C is discharged. Thus, a negative feedback is applied. The amount of increase ΔV of the source potential Vs therefore represents the amount of negative feedback.

Accordingly, the drain-source current Ids flowing in the drive transistor 1B is input to the gate of the drive transistor 1B, that is, the drain-source current Ids is negatively fed back to the gate-source voltage Vgs, thereby canceling the dependency of the drain-source current Ids of the drive transistor 1B upon the mobility μ. That is, mobility correction for correcting the variation in the mobility μ for each pixel is performed.

More specifically, the higher the signal voltage Vin of the video signal, the greater the drain-source current Ids and therefore the larger the absolute value of the amount of negative feedback (amount of correction) ΔV. Accordingly, mobility correction can be performed in accordance with the light emission luminance level. When the signal voltage Vin of the video signal is kept constant, the higher the mobility μ of the drive transistor 1B, the larger the absolute value of the amount of negative feedback ΔV. Thus, the variation of the mobility μ for each pixel can be removed. A principle of mobility correction will be described below.

(Light-Emission Period)

Figure 6C:
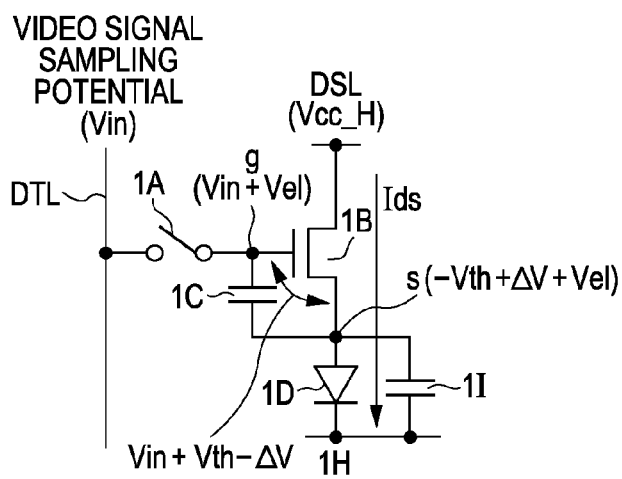

Then, at time t10, a transition of the potential WS of the scanning line WSL to the low-potential side brings the writing transistor 1A into the non-conducting state, as shown in FIG. 6C. Thus, the gate electrode of the drive transistor 1B is separated from the signal line DTL and becomes floating.

The gate electrode of the drive transistor 1B becomes floating and, at the same time, the drain-source current Ids in the drive transistor 1B starts to flow in the organic EL element 1D. Thus, the anode potential of the organic EL element 1D increases in accordance with the drain-source current Ids in the drive transistor 1B.

The increase in the anode potential of the organic EL element 1D is equivalent to the increase in the source potential Vs of the drive transistor 1B. As the source potential Vs of the drive transistor 1B increases, the gate potential Vg of the drive transistor 1B also increases in accordance therewith due to the bootstrap operation of the storage capacitor 1C.

At this time, if it is assumed that the bootstrap gain is 1 (ideal value), the amount of increase in the gate potential Vg is equal to the amount of increase in the source potential Vs. Therefore, the gate-source voltage Vgs of the drive transistor 1B during the light-emission period is kept at a constant value given by Vin+Vth−ΔV. Then, at time t11, the potential of the signal line DTL is switched from the signal voltage Vin of the video signal to the signal line reference potential Vo.

As can be understood from the operations described above, in the present example, threshold correction periods are provided over a total of 3H periods, that is, a 1H period during which signal writing and mobility correction are performed and 2H periods preceding the 1H period. Thus, a sufficient period of time can be ensured as threshold correction periods. This ensures that the threshold voltage Vth of the drive transistor 1B can be detected and stored in the storage capacitor 1C, and also ensures that the threshold correction operation can reliably be performed.

While threshold correction periods are provided over 3H periods, this is merely an example. If a sufficient length of threshold correction period can be ensured within a 1H period during which signal writing and mobility correction are performed, it is not necessary to set a threshold correction period over preceding horizontal periods. Conversely, if the length of 1H period is short due to the improved definition and even if threshold correction periods provided over 3H periods are not sufficient, threshold correction periods can be set over 4H periods or more.

2. Problems Caused by Short between Gate of Drive Transistor and Cathode

Equivalent Circuit

Figure 7A:
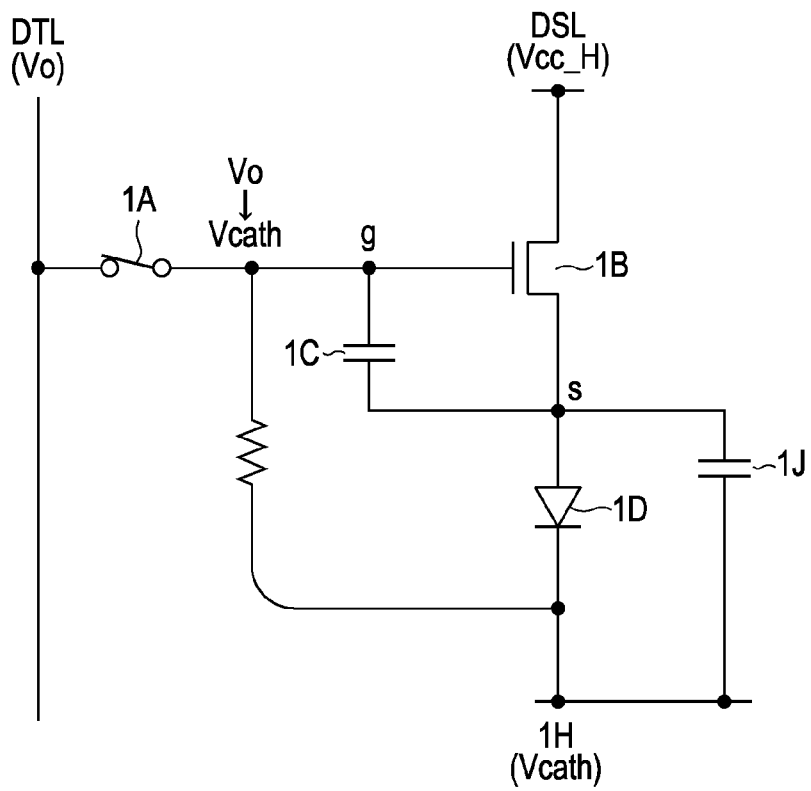
FIGS. 7A and 7B are diagrams illustrating the effect of a short on a drive transistor.

FIG. 7A shows an equivalent circuit of the pixel circuit shown in FIG. 2 in which the gate g of the drive transistor 1B and the cathode 1H are electrically shorted to each other. At this operation timing, by way of example, as shown in FIGS. 4D, 5B, and 5D, the video signal reference potential Vo is written.

In this manner, an electrical short between the gate g of the drive transistor 1B and the cathode 1H wired so as to have a low impedance causes conduction between the video signal line DTL, the gate g of the drive transistor 1B, and a cathode 1H when the writing transistor 1A is turned on. Therefore, the video signal reference potential Vo supplied to the video signal lines DTL is drawn to the cathode potential Vcath.

Figure 7B:
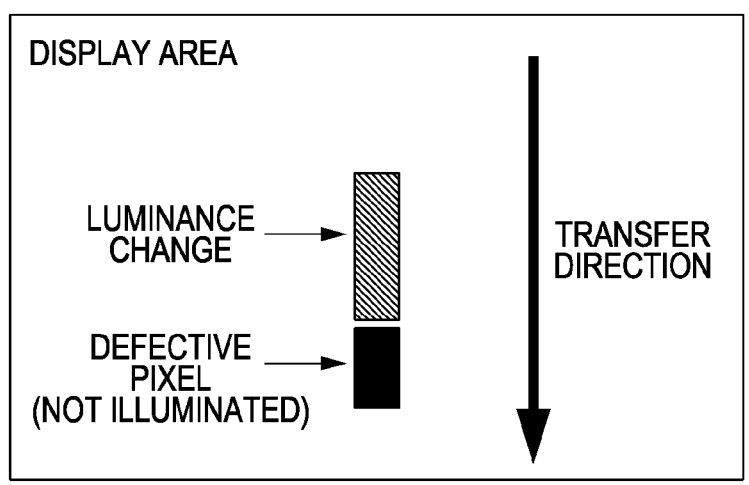

FIG. 7B is a schematic diagram showing a display state where the defect shown in FIG. 7A has occurred. A defective pixel, that is, a pixel in which, as shown in FIG. 7A, the gate g of the drive transistor 1B and the cathode 1H are electrically shorted to each other, is not illuminated. Further, several pixels preceding in the transfer direction form a luminance change area. The luminance change area depends on the transfer direction, and occurs on the side preceding in the transfer direction all the time.

Timing Waveform Diagram

Figure 8:
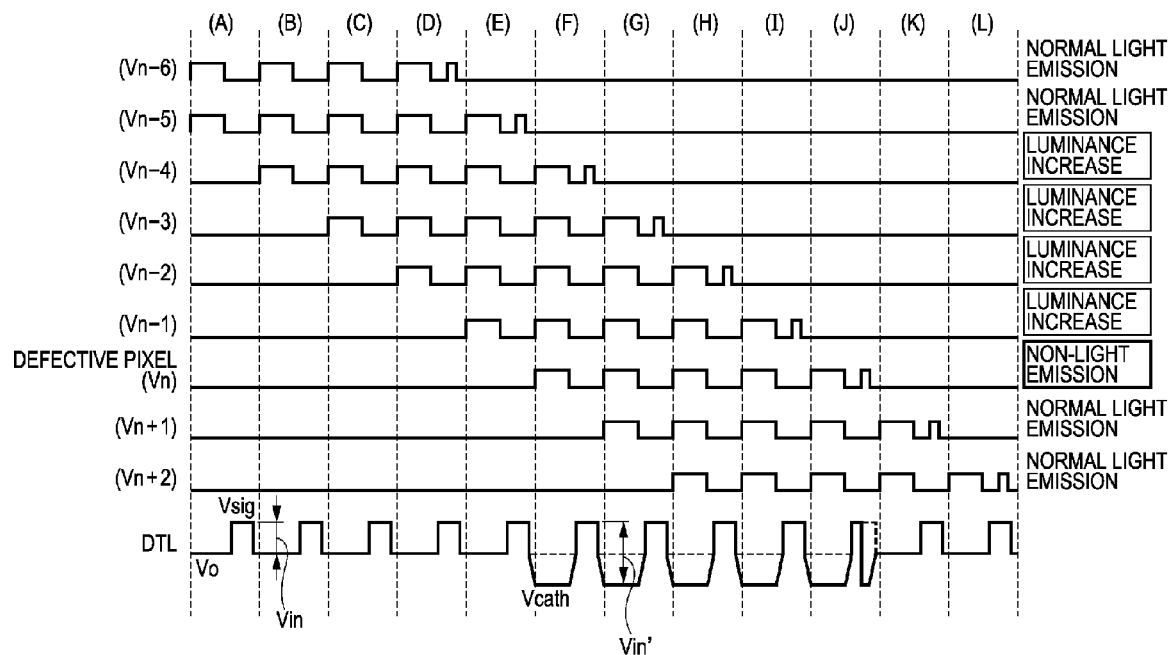
FIG. 8 is a timing waveform diagram when a defect has occurred.

FIG. 8 is a timing waveform diagram when the defect shown in FIG. 7A has occurred. Further, in FIG. 7A, the relationship Vo>Vcath holds by way of example. In the timing waveform diagram shown in FIG. 8, the timings of the scanning lines having scanning line numbers are represented in association with pixels Vn−6 to Vn+2, and the pixel Vn is a defective pixel. Changes in video signal potential are represented using DTL. In FIG. 8, each of periods (A) to (L) corresponds to one horizontal period (1H).

As shown in FIG. 7A, if the gate g of the drive transistor 1B and the cathode 1H are electrically shorted to each other, a problem occurs in the periods (F) to (J) shown in FIG. 8. Within those periods, at the time of a transition of the scanning line WSL corresponding to the defective pixel Vn to the high-potential side, the potential supplied to the video signal line DTL is drawn to the cathode potential Vcath.

Consequently, in each of the pixels Vn−4 to Vn−1, the video signal reference potential Vo immediately before the sampling of the video signal potential is drawn to the cathode potential Vcath. Thus, the input signal to the gate g of the drive transistor 1B has an amplitude given by Vin'=Vsig−Vcath instead of Vin=Vsig−Vo.

In FIG. 8, since Vo>Vcath holds, a signal with a higher amplitude is equivalently written in each of the pixels Vn−4 to Vn−1 than that based on the video signal reference potential Vo. This leads to increased luminance levels in the pixels Vn−4 to Vn−1. Consequently, luminance increases in several pixels preceding the defective pixel, which is perceived as a linear luminance increasing area. In the defective pixel Vn, the video signal potential Vsig is also drawn to the cathode potential Vcath, resulting in no light emission therefrom.

3. Example Configuration According to Present Embodiment

Pixel Circuit

Figure 9A:
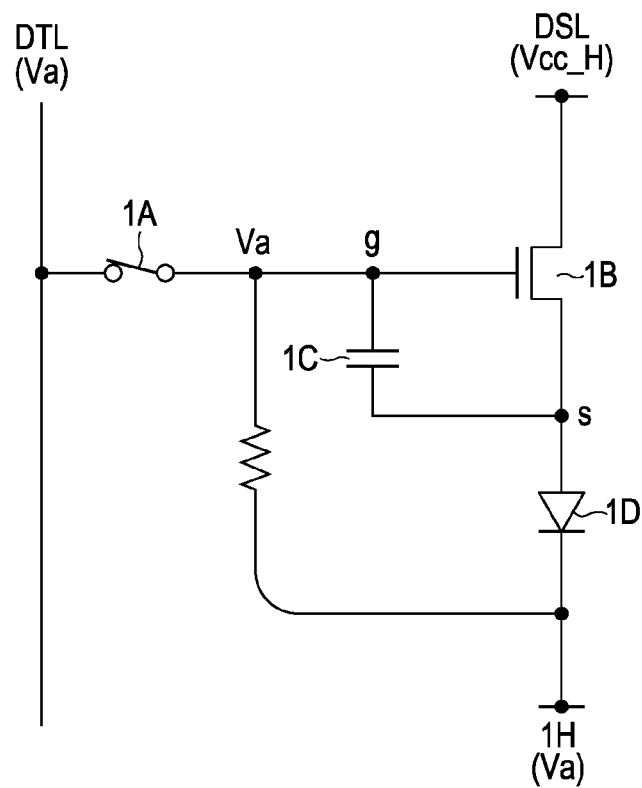
FIGS. 9A and 9B are circuit diagrams illustrating an example of the setting of a pixel potential according to the present embodiment.

FIG. 9A is a circuit diagram illustrating an example of the setting of a pixel potential according to the present embodiment. The pixel circuit includes an organic EL element 1D, a drive transistor 1B, a writing transistor 1A, and a storage capacitor 1C.

Specifically, an anode electrode of the organic EL element 1D is connected to a source electrode of the drive transistor 1B, and a gate electrode of the drive transistor 1B is connected to a source electrode or drain electrode of the writing transistor 1A. The storage capacitor 1C is further connected between the gate and source electrodes of the drive transistor 1B.

The signal line DTL is connected to the drain electrode or source electrode of the writing transistor 1A. A gate electrode of the writing transistor 1A is connected to a scanning line (not shown), and is given a predetermined timing. A power supply line DSL is connected to the drain electrode of the drive transistor 1B.

In the above configuration of the pixel circuit, in the present embodiment, the video signal reference potential Vo applied to the signal line DTL and the potential (cathode potential) Vcath of a cathode electrode of the organic EL element 1D have a same potential, namely, a potential Va. Thus, the video signal reference potential Vo is not drawn to a potential higher or lower than the potential Va even within the periods (F) to (J) shown in FIG. 8. This can prevent a luminance change area from occurring across the preceding pixels.

Note that the video signal reference potential Vo and the cathode potential Vcath not be set to desired values with respect to the other driving potentials, and satisfy the driving conditions such as threshold correction operations shown in FIG. 3. In order to set the video signal reference potential Vo and the cathode potential Vcath to the same potential value, in addition to adjusting the video signal reference potential Vo so as to be equal to the cathode potential Vcath, the cathode potential Vcath may also be adjusted so as to be equal to the video signal reference potential Vo. Alternatively, the video signal reference potential Vo and the cathode potential Vcath may be adjusted so as to be equal to any other constant potential. Preferably, the potential Va is set to the existing setting potential Vo or Vcath, thereby satisfying the driving conditions shown in FIG. 3.

System Configuration

Figure 10:
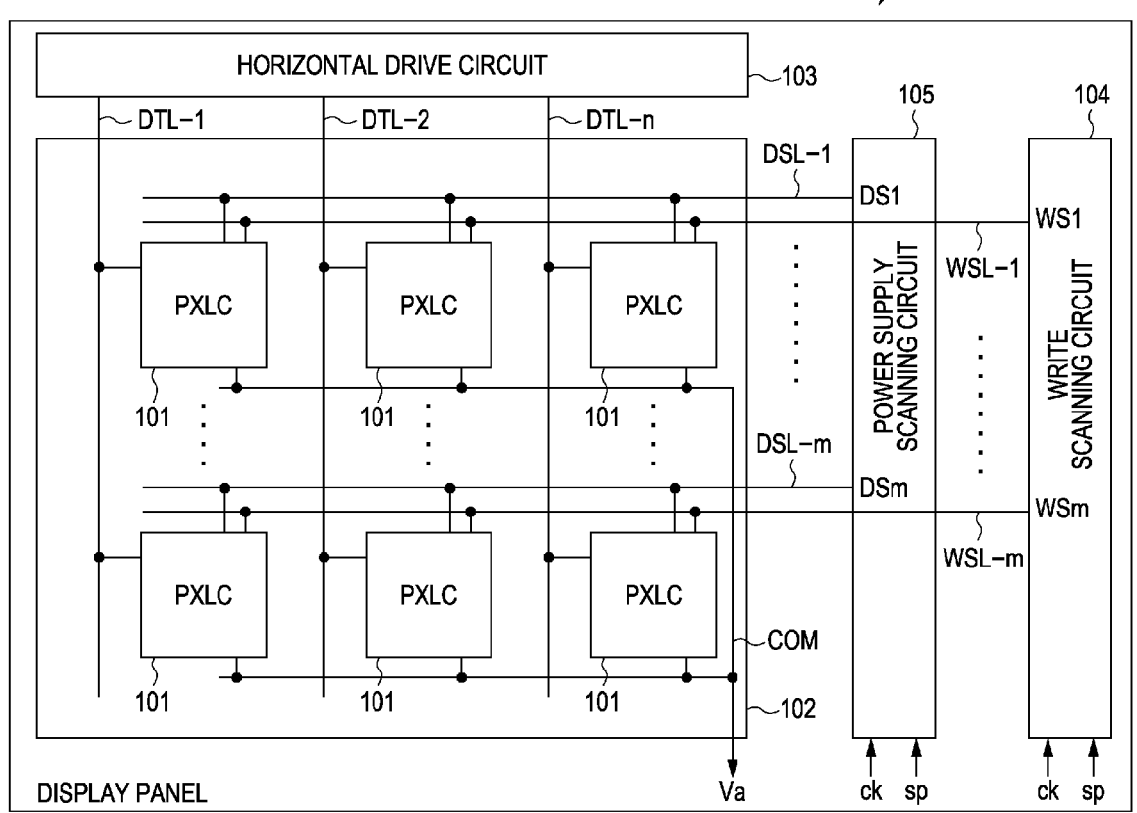
FIG. 10 is a system configuration diagram showing an example of a display device according to the present embodiment.

FIG. 10 is a system configuration diagram showing an example of the present embodiment. As shown in FIG. 10, an organic EL display device 100 is configured to include a pixel array unit 102 having pixels (PXLC) 101 arranged in a two-dimensional matrix, and a driving unit arranged around the pixel array unit 102 to drive the pixels 101. The driving unit for driving the pixels 101 includes, for example, a horizontal drive circuit 103, a write scanning circuit 104, and a power supply scanning circuit 105.

The pixel array unit 102 has scanning lines WSL-1 to WSL-m, power supply lines DSL-1 to DSL-m, and signal lines DTL-1 to DTL-n for the m-row n-column pixel array. The scanning lines WSL-1 to WSL-m and the power supply lines DSL-1 to DSL-m are disposed for the individual rows, and the signal lines DTL-1 to DTL-n are disposed for the individual pixel columns. The above configuration is the same as the system configuration shown in FIG. 1.

In the present embodiment, a video signal reference potential Vo applied to the pixels 101 from the signal lines DTL-1 to DTL-n and the potential of the cathode electrode (cathode potential) of the organic EL element in each of the pixels 101 are set to the same potential, Va.

The cathode potential is supplied as a common potential to the organic EL elements of the individual pixels 101. Thus, the potential Va is supplied to a common wiring COM which is brought into conduction with the cathode electrodes of the organic EL elements in the individual pixels 101.

The video signal reference potential Vo supplied from the signal lines DTL-1 to DTL-n is also set to the potential Va. The horizontal drive circuit 103 selectively supplies a signal potential Vin and the video signal reference potential Vo to the signal lines DTL-1 to DTL-n. Thus, the horizontal drive circuit 103 performs control so as to supply the potential Va when selecting the video signal reference potential Vo.

Thus, a video signal reference potential is supplied to a signal line for a period during which a scanning signal is supplied to a scanning line during the driving of the preceding pixel row, thus preventing the video signal reference potential from being drawn to a potential higher or lower than the potential Va for a period during which threshold correction is performed on a drive transistor in the current pixel. That is, even when a gate of a drive transistor and a cathode of an organic EL element are electrically shorted to each other, a luminance change area can be prevented from occurring across the preceding pixels.

Driving Method

Figure 11:
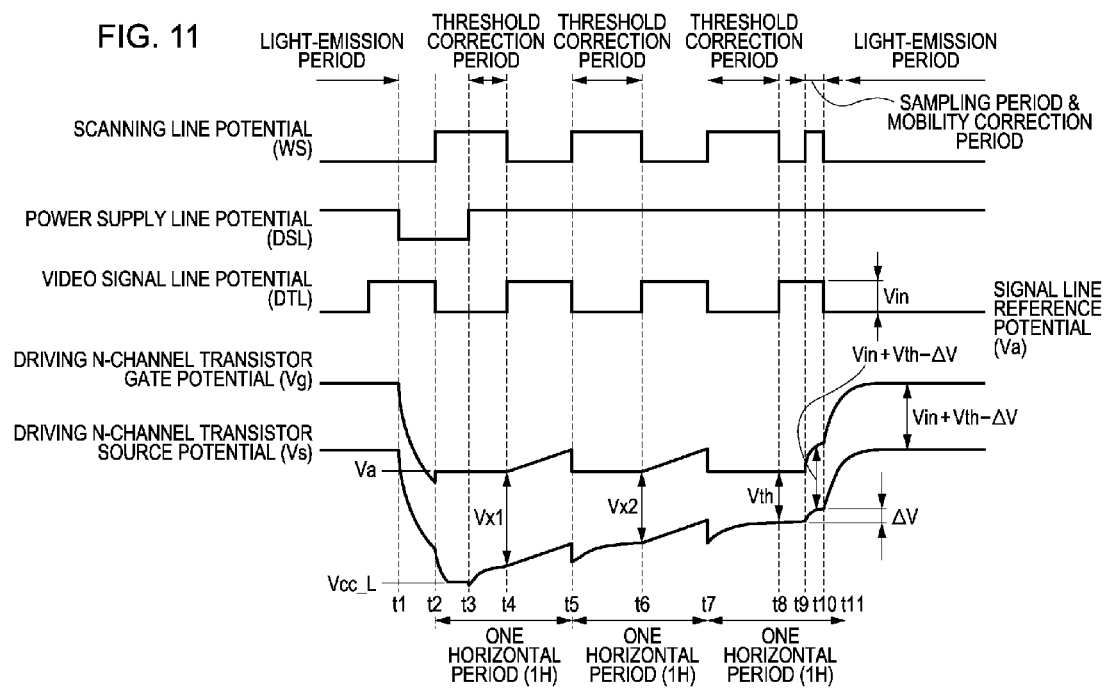
FIG. 11 is a timing waveform diagram illustrating a method for driving a display device according to the present embodiment.

FIG. 11 is a timing waveform diagram illustrating a method for driving a display device according to the present embodiment. The timing waveform diagram shown in FIG. 11 is similar to the timing waveform diagram shown in FIG. 3 in that a light-emission period, threshold correction periods, and a sampling period & mobility correction period are repeated, but is different in that a video signal reference potential supplied to a signal line is set to the potential Va, which is the same as the cathode potential.

The video signal line potential (DTL) is selectively switched between the video signal Vin and the video signal reference potential Va. The video signal reference potential is set to the potential Va, thereby setting the gate potential (Vg) of the drive transistor to the potential Va within the threshold correction periods. Since all the pixels are based on the same potential Va, uniformity in luminance can be maintained.

Figure 12:
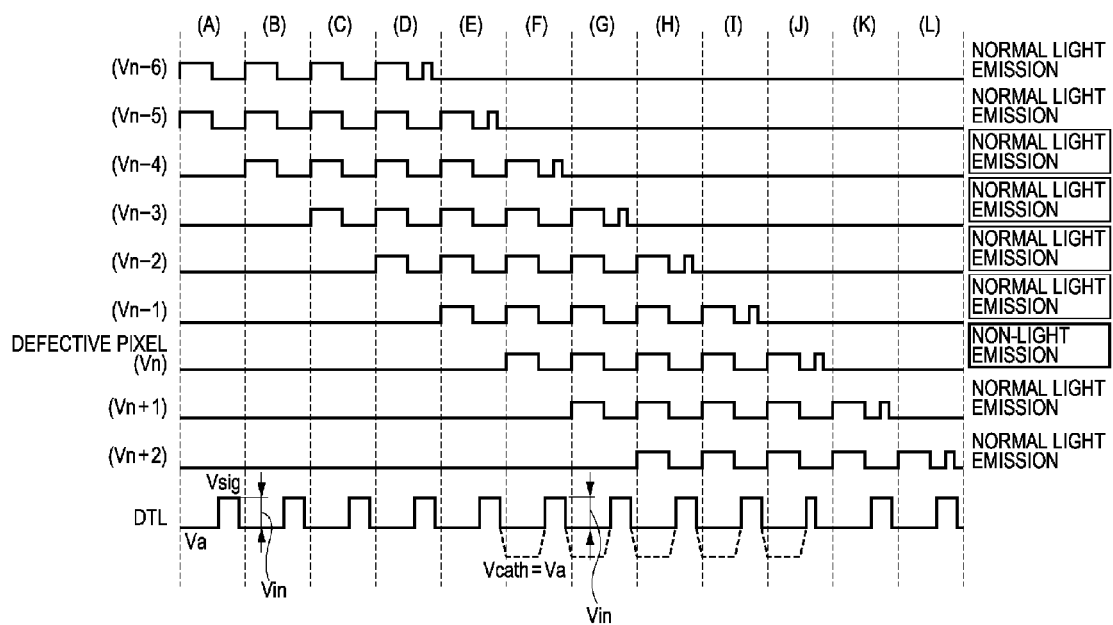
FIG. 12 is a timing waveform diagram when a defect has occurred in the pixel configuration according to the present embodiment.

FIG. 12 is a timing waveform diagram when a defect has been caused in the pixel configuration shown in FIG. 9A according to the present embodiment due to an electrical short between the gate g of the drive transistor 1B and the cathode 1H. In the timing waveform diagram shown in FIG. 12, the timings of the scanning lines having scanning line numbers are represented in association with pixels Vn−6 to Vn+2, and the pixel Vn is a defective pixel. Changes in video signal potential are represented using DTL. In FIG. 12, each of periods (A) to (L) corresponds to one horizontal period (1H).

As shown in FIG. 9A, if the gate g of the drive transistor 1B and the cathode 1H are electrically shorted to each other, an existing configuration may cause a problem in the periods (F) to (J) shown in FIG. 12. That is, within those periods, at the time of a transition of the scanning line WSL corresponding to the defective pixel Vn to the high-potential side, the potential supplied to the video signal line DTL is drawn to the cathode potential Vcath (see portions indicated by broken lines shown in FIG. 12).

In the configuration of the present embodiment, in contrast, the video signal reference potential Vo applied to the video signal line DTL is equal to the potential Va, and the cathode potential Vcath is equal to the potential Va. That is, control is performed so that the video signal reference potential Vo and the cathode potential Vcath are set to the same potential Va.

Consequently, in each of the pixels Vn−4 to Vn−1, the video signal reference potential Vo immediately before the sampling of the video signal potential is equal to the potential Va, thus providing the same criterion as that of the other pixels. Thus, the input signal to the gate g of the drive transistor 1B has an amplitude given by Vin=Vsig−Va, resulting in no increase in luminance of several pixels preceding the defective pixel Vn.

In the embodiment described above, the application to an organic EL display device including organic EL elements as electro-optical elements of the pixels 101 has been described by way of example. However, embodiments of the present invention are not limited to this application example, and can be applied to any display device including a current-driven electro-optical element (light-emitting element) whose light emission luminance changes in accordance with the current value of a current flowing in the device.

Furthermore, the pixels 101 each having a 2Tr/1C pixel configuration including two transistors (Tr) and one capacitor (C) by way of example. However, embodiments of the present invention are not limited thereto, and can also be applied to any other pixel configuration such as a 4Tr/1C pixel configuration including four transistors (Tr) and one capacitor (C).

4. Application Examples

The display device according to the present embodiment described above can be applied in various electronic apparatuses shown in FIGS. 13 to 17G, by way of example. The display device can be applied to display devices used in electronic apparatuses in any field that is configured such that a video signal input to an electronic apparatus or a video signal generated in an electronic apparatus can be displayed as an image or video, such as a digital camera, a notebook-sized personal computer, a mobile terminal device such as a mobile phone, and a video camera.

The use of the display device according to the present embodiment as a display device in electronic apparatuses in any field provides improved quality of a displayed image. Therefore, advantageously, various electronic apparatuses allow the high-quality display of images.

The display device according to the present embodiment may also include a module having a sealed configuration. For example, a display module may be formed so as to be attached to a transparent facing portion of glass or the like that faces the pixel array unit 102. The transparent facing portion may have a color filter, a protective film, and the like, and may also have a light shielding film. The display module may have a circuit unit configured to input or output a signal or the like to a pixel array unit from the outside, a flexible printed circuit (FPC), and the like.

Specific examples of electronic apparatuses in which the display device of the present embodiment can be applied will be described.

Figure 13:
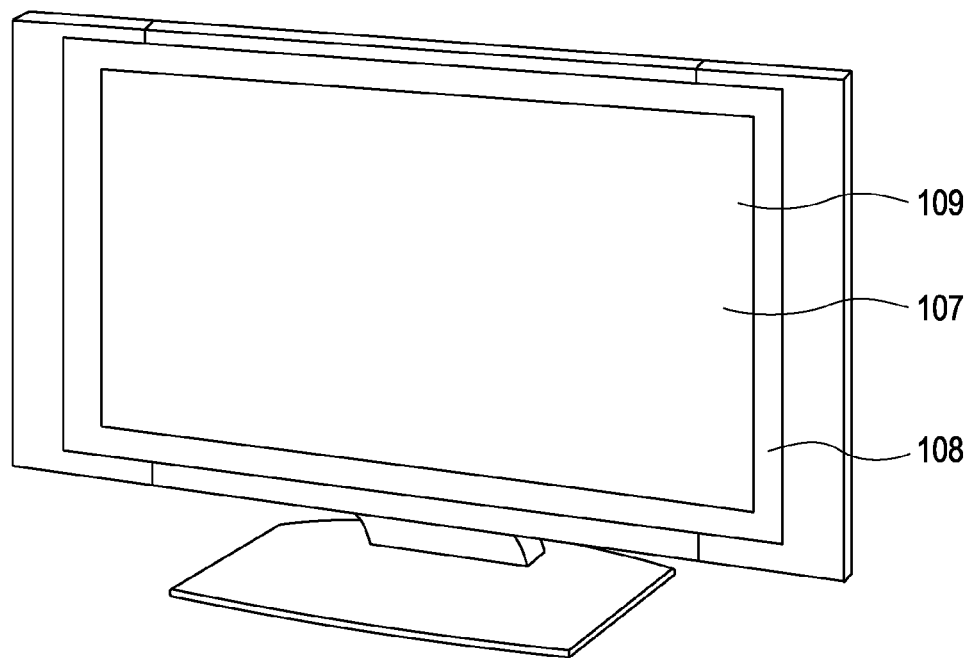
FIG. 13 is a perspective view showing the appearance of a television set according to an application example of the present embodiment.

FIG. 13 is a perspective view showing the appearance of a television set according to an application example of the present embodiment. The television set according to the application example includes a video display screen unit 107 having a front panel 108, a glass filter 109, and the like. The video display screen unit 107 can be implemented by using the display device according to the present embodiment.

Figure 14A:
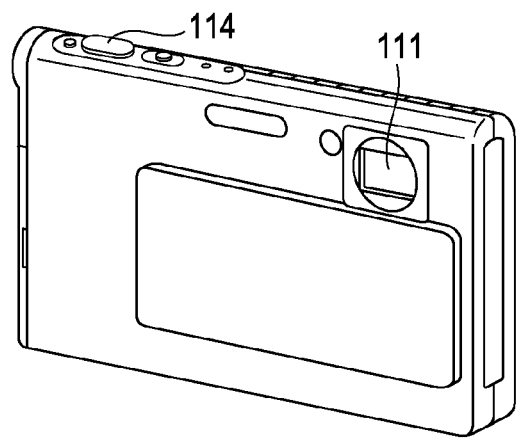
FIGS. 14A and 14B are perspective views showing the appearance of a digital camera according to another application example of the present embodiment and showing the front and rear of the digital camera, respectively.
Figure 14B:
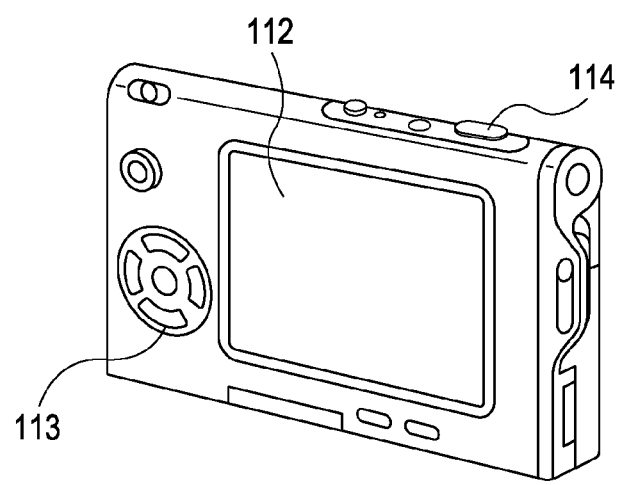

FIGS. 14A and 14B are perspective views showing the appearance of a digital camera according to another application example of the present embodiment and showing the front and rear of the digital camera, respectively. The digital camera according to the present application example includes a light emitting unit 111 for emitting flash light, a display unit 112, a menu switch 113, and a shutter button 114. The display unit 112 can be implemented by using the display device according to the present embodiment.

Figure 15:
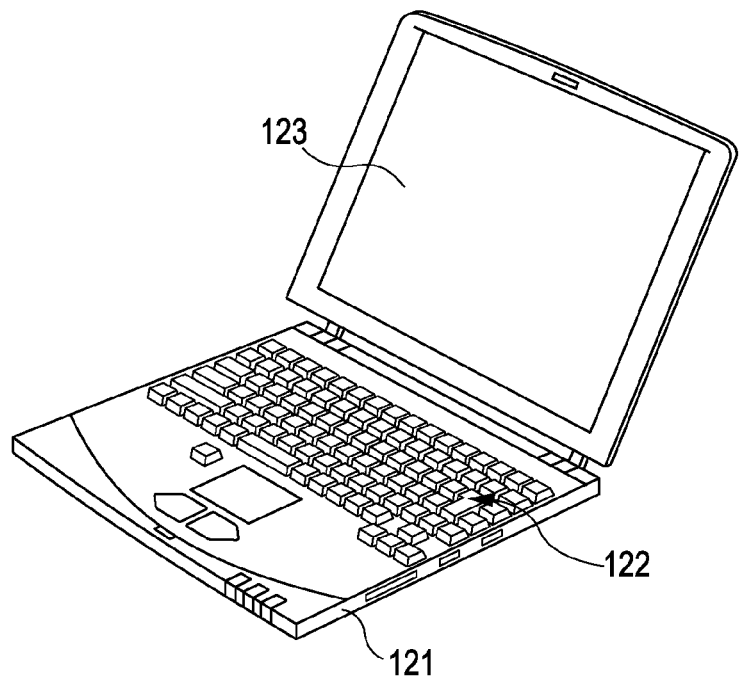
FIG. 15 is a perspective view showing the appearance of a notebook-sized personal computer according to another application example of the present embodiment.

FIG. 15 is a perspective view showing the appearance of a notebook-sized personal computer according to an application example of the present embodiment. The notebook-sized personal computer according to the present application example has a main body 121 including a keyboard 122 which is operated to enter characters or the like, and a display unit 123 for displaying an image. The display unit 123 can be implemented by using the display device according to the present embodiment.

Figure 16:
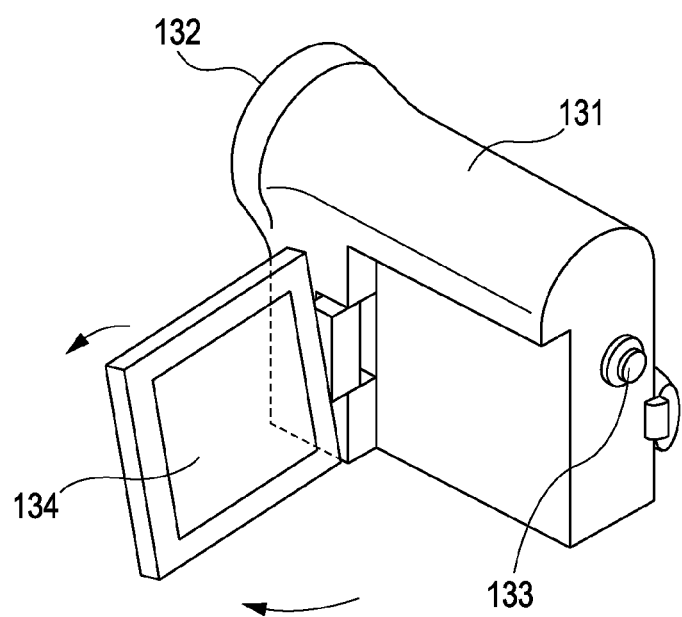
FIG. 16 is a perspective view showing the appearance of a video camera according to another application example of the present embodiment.

FIG. 16 is a perspective view showing the appearance of a video camera according to an application example of the present embodiment. The video camera according to the present application example includes a main unit 131, a lens 132 disposed on a side surface of the video camera so as to be directed toward the front and configured to photograph a subject, a start/stop switch 133 which is operated for photographing, and a display unit 134. The display unit 134 can be implemented by using the display device according to the present embodiment.

FIGS. 17A to 17G are external views showing a mobile terminal device according to an application example of the present embodiment, for example, a mobile phone. FIGS. 17A and 17B are a front view and a side view of the mobile phone which is in its open state, respectively. FIGS. 17C, 17D, 17E, 17F, and 17G are a front view, a left side view, a right side view, a top view, and a bottom view of the mobile phone which is in its closed state, respectively. The mobile phone according to the present application example includes an upper housing 141, a lower housing 142, a connection portion (here, a hinge portion) 143, a display 144, a sub-display 145, a picture light 146, and a camera 147. The display 144 or the sub-display 145 can be implemented by using the display device according to the present embodiment.

A description will now be given of other features of the embodiment of the present invention for avoiding an electrical short between a gate electrode of a drive transistor and a second electrode of an electro-optical element.

FIGS. 18A to 18C are diagrams illustrating a wiring structure of a pixel. FIG. 18A is a plan view of the pixel, and FIGS. 18B and 18C are cross-sectional views taken along the lines XVIIIB-XVIIIB and XVIIIC-XVIIIC of FIG. 18A. As in a pattern layout shown in FIG. 18A, a storage capacitor 1C and an auxiliary capacitor 1J are generally arranged so that, in terms of the area occupied thereby and pattern layout efficiency, at least one side of the storage capacitor 1C and at least one side of the auxiliary capacitor 1J are adjacent to each other.

As shown in the cross-sectional view of FIG. 18B, the storage capacitor 1C and the auxiliary capacitor 1J are arranged so that first electrodes D1 are adjacent to each other on a glass substrate and second electrodes are integrally formed into a polysilicon electrode p-Si with a gate insulating film M1 between the first electrodes D1 and the second electrodes. When a polysilicon electrode p-Si is formed using a low-temperature polysilicon process, the storage capacitor 1C and the auxiliary capacitor 1J are formed of parallel flat plates in such a manner that the first electrodes D1 are formed as first metal wirings and the second electrodes are formed as a polysilicon electrode p-Si.

In FIG. 18C, in order to illustrate the relationship shown in FIG. 18B between the wiring layout and the upper and lower electrodes serving as the storage capacitor 1C and the auxiliary capacitor 1J shown in FIG. 7A, the numbers in the parentheses in FIG. 18C represent the reference numerals of the electrodes shown in FIG. 7A. The first metal wiring serving as the first electrode D1(g) of the storage capacitor 1C is connected to the gate g of the drive transistor 1B, and the polysilicon electrode p-Si(s) serving as the second electrode is connected to the source s of the drive transistor 1B. Further, the first metal wiring serving as the first electrode D1(1H) of the auxiliary capacitor 1J is connected to the cathode 1H of the organic EL element 1D, and the polysilicon electrode p-Si(s) serving as the second electrode is connected to the source s of the drive transistor 1B.

In the low-temperature polysilicon process, however, since it is difficult to perfectly avoid the occurrence of pattern defects due to dust or the like generated during the manufacturing process, laser repair techniques in the TFT manufacturing process are also employed. In particular, a short due to a pattern defect in wirings in the same layer occurs at a significantly higher rate than that of a short in interlayer wirings.

That is, in FIGS. 18A to 18C, the first electrodes D1 of the storage capacitor 1C and the auxiliary capacitor 1J are provided adjacent to each other in the same layer (first metal wirings). Thus, dust or the like is likely to be attached to wirings in the manufacturing process, resulting in a risk of a short occurring therebetween. The short between the wirings corresponds to a short shown in FIG. 7A between the gate g of the drive transistor 1B and the cathode of the organic EL element 1D (the source s of the drive transistor 1B), and may cause a change in the luminance of a defective pixel and pixels preceding in the transfer direction.

5. Example Configuration According to Present Embodiment

Pixel Circuit

Figure 9B:
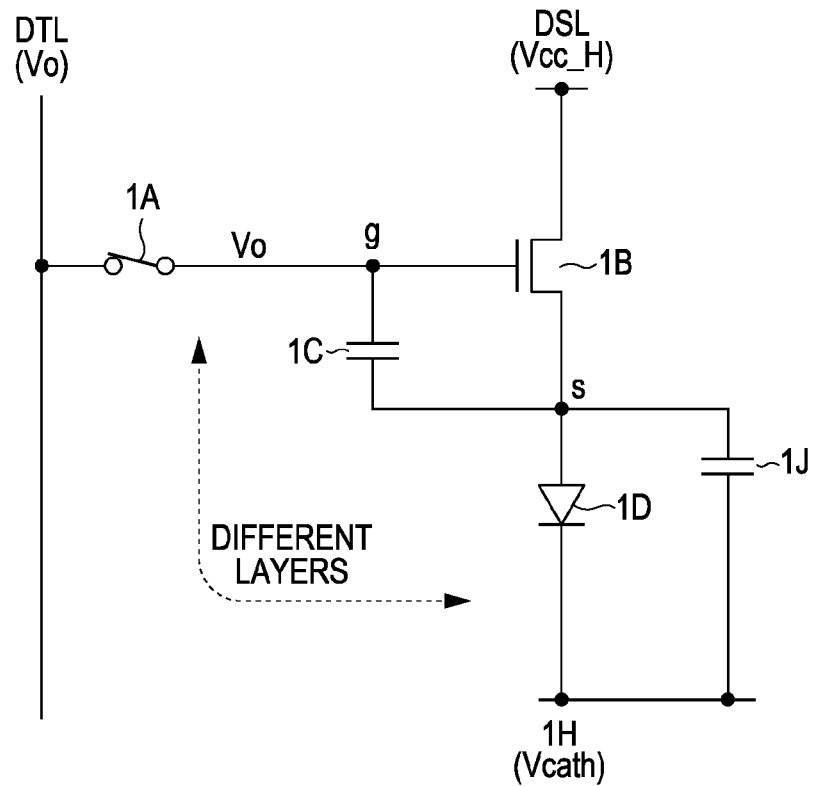

FIG. 9B is a circuit diagram illustrating the setting of a pixel potential. The pixel circuit includes an organic EL element 1D, a drive transistor 1B, a writing transistor 1A, and a storage capacitor 1C.

Specifically, an anode electrode of the organic EL element 1D is connected to a source electrode of the drive transistor 1B, and a gate electrode of the drive transistor 1B is connected to a source electrode or drain electrode of the writing transistor 1A. The storage capacitor 1C is further connected between the gate and source electrodes of the drive transistor 1B. In addition, an auxiliary capacitor 1J is connected between the anode (first electrode) and cathode (second electrode) of the organic EL element 1D.

The signal line DTL is connected to the drain electrode or source electrode of the writing transistor 1A. A gate electrode of the writing transistor 1A is connected to a scanning line (not shown), and is given a predetermined timing. A power supply line DSL is connected to the drain electrode of the drive transistor 1B.

In the above configuration of the pixel circuit, in the present embodiment, the storage capacitor 1C and the auxiliary capacitor 1J are arranged adjacent to each other, and the wiring of the storage capacitor 1C, which is brought into conduction with the gate electrode of the drive transistor 1B, and the wiring of the auxiliary capacitor 1J, which is brought into conduction with the cathode electrode of the organic EL element 1D, are provided in different layers, which constitutes a feature.

Furthermore, in the present embodiment, in the above configuration of the pixel circuit, the wiring of the storage capacitor 1C, which is brought into conduction with the source electrode of the drive transistor 1B, and the wiring of the auxiliary capacitor 1J, which is brought into conduction with the anode electrode of the organic EL element 1D, are provided in different layers.

Therefore, since the wiring of the storage capacitor 1C, which is brought into conduction with the gate electrode of the drive transistor 1B, and the wiring of the auxiliary capacitor 1J, which is brought into conduction with the cathode electrode of the organic EL element 1D, are provided in different layers, the occurrence of a short between the wirings can be more effectively avoided as compared with the case where they are provided in the same layer.

Here, the above wirings are principal wirings that are disposed on a flat surface of a substrate and a flat surface on an insulating film on the substrate, and contacts and the like provided between layers are not included. In the present embodiment, one of the above wirings is formed of a first metal wiring and the other is formed of polysilicon, which is formed with respect to the first metal wiring with a gate insulating film therebetween.

System Configuration

FIG. 10 is a system configuration diagram showing an example of the present embodiment. As shown in FIG. 10, an organic EL display device 100 is configured to include a pixel array unit 102 having pixels (PXLC) 101 arranged in a two-dimensional matrix, and a driving unit arranged around the pixel array unit 102 to drive the pixels 101. The driving unit for driving the pixels 101 includes, for example, a horizontal drive circuit 103, a write scanning circuit 104, and a power supply scanning circuit 105.

The pixel array unit 102 has scanning lines WSL-1 to WSL-m, power supply lines DSL-1 to DSL-m, and signal lines DTL-1 to DTL-n for the m-row n-column pixel array. The scanning lines WSL-1 to WSL-m and the power supply lines DSL-1 to DSL-m are disposed for the individual rows, and the signal lines DTL-1 to DTL-n are disposed for the individual pixel columns. The above configuration is the same as the system configuration shown in FIG. 1.

Wiring Structure

Figure 19A:
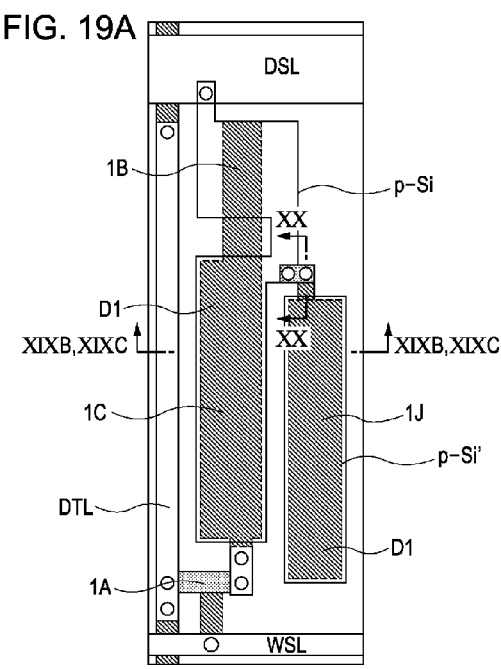
FIGS. 19A to 19C are diagrams (first part) illustrating an example wiring structure according to the present embodiment.
Figure 19B:
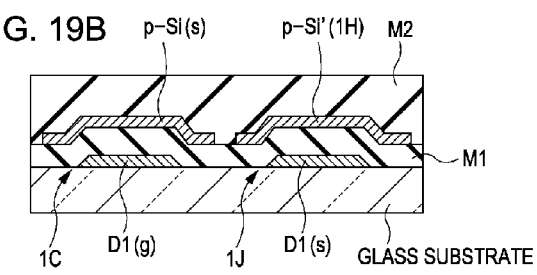
Figure 19C:
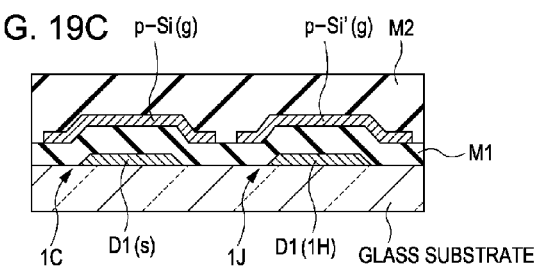
Figure 20:
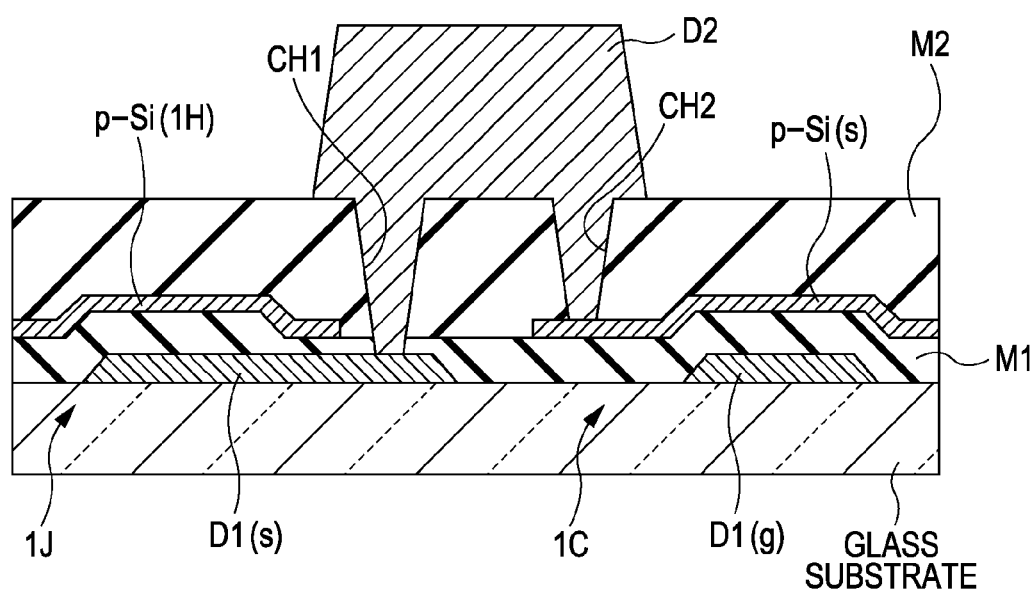
FIG. 20 is a diagram (second part) illustrating the example wiring structure according to the present embodiment.

FIGS. 19A to 20 are diagrams illustrating an example wiring structure according to the present embodiment. FIG. 19A is a plan view, and FIGS. 19B and 19C are cross-sectional views taken along the lines XIXB-XIXB and XIXC-XIXC of FIG. 19A, respectively. FIG. 20 is a cross-sectional view taken along the line XX-XX of FIG. 19A. As in a pattern layout shown in FIG. 19A, the storage capacitor 1C and the auxiliary capacitor 1J are arranged so that, in terms of the area occupied thereby and pattern layout efficiency, at least one side of the storage capacitor 1C and at least one side of the auxiliary capacitor 1J are adjacent to each other.

The storage capacitor 1C is formed as a parallel flat plate having a first electrode D1 and a polysilicon electrode p-Si serving as a second electrode, and the auxiliary capacitor 1J is formed as a parallel flat plate having a first electrode D1 and a polysilicon electrode p-Si' serving as a second electrode. In the present embodiment, therefore, the second electrodes of the storage capacitor 1C and the auxiliary capacitor 1J are implemented by using separate polysilicon electrodes instead of an integrated electrode.

Furthermore, the electrode of the storage capacitor 1C, which is brought into conduction with the gate g of the drive transistor 1B, and the electrode of the auxiliary capacitor 1J, which is brought into conduction with the cathode 1H of the organic EL element 1D, are provided in different wiring layers. That is, one of the electrode of the storage capacitor 1C, which is brought into conduction with the gate g of the drive transistor 1B, and the electrode of the auxiliary capacitor 1J, which is brought into conduction with the cathode 1H of the organic EL element 1D, is defined in the layer of a first metal wiring, and the other is defined in the layer of a polysilicon electrode p-Si.

FIGS. 19B and 19C show specific examples of wirings. In the figures, the numerals in the parentheses correspond to the numerals of the electrode shown in FIG. 9B.

First, in the specific example shown in FIG. 19B, the storage capacitor 1C is configured such that the first electrode D1($g$) serving as the first metal wiring is connected to the gate g of the drive transistor 1B and the polysilicon electrode p-Si($s$) serving as the second electrode is connected to the source s of the drive transistor 1B. The auxiliary capacitor 1J is configured such that the first electrode D1($s$) serving as the first metal wiring is connected to the source s of the drive transistor 1B and the polysilicon electrode p-Si'(1H) serving as the second electrode is connected to the cathode 1H of the organic EL element 1D.

Accordingly, the electrode D1(g) of the storage capacitor 1C, which is brought into conduction with the gate g of the drive transistor 1B, and the electrode (polysilicon electrode p-Si'(1H)) of the auxiliary capacitor 1J, which is brought into conduction with the cathode 1H of the organic EL element 1D, are provided in different wiring layers. Since these wirings are not in the same layer, a structure in which a short is less likely to occur due to dust or the like generated during the manufacturing process can be realized.

In the above wiring structure, furthermore, the second electrodes of the storage capacitor 1C and the auxiliary capacitor 1J are also provided in different wiring layers. Since the layers are positioned with an insulating layer diagonally held therebetween, the risk of a pattern short can be significantly reduced as compared with the case where the second electrodes are provided in the same layer.

Next, in the specific example shown in FIG. 19C, the storage capacitor 1C is configured such that the first electrode D1(s) serving as the first metal wiring is connected to the source s of the drive transistor 1B and the polysilicon electrode p-Si(g) serving as the second electrode is connected to the gate g of the drive transistor 1B. The auxiliary capacitor 1J is configured such that the first electrode D1(1H) serving as the first metal wiring is connected to the cathode 1H of the organic EL element 1D and the polysilicon electrode p-Si'(s) serving as the second electrode is connected to the source s of the drive transistor 1B. In other words, the wiring structure shown in FIG. 19C has an opposite connection relationship to the connection relationship between the wirings of the electrodes of the respective capacitors shown in FIG. 19B.

Accordingly, the electrode D1(g) of the storage capacitor 1C, which is brought into conduction with the gate g of the drive transistor 1B, and the electrode (polysilicon electrode p-Si'(1H)) of the auxiliary capacitor 1J, which is brought into conduction with the cathode 1H of the organic EL element 1D, are provided in different wiring layers. Since these wirings are not in the same layer, a structure in which a short is less likely to occur due to dust or the like generated during the manufacturing process can be realized.

In the above wiring structure, furthermore, the second electrodes of the storage capacitor 1C and the auxiliary capacitor 1J are also provided in different wiring layers. Since the layers are positioned with an insulating layer diagonally held therebetween, the risk of a pattern short can be significantly reduced as compared with the case where the second electrodes are provided in the same layer.

FIG. 20 is a cross-sectional view taken along the line XX-XX of FIG. 19A. In FIG. 20, the wiring relationship between the electrodes shown in FIG. 19B is illustrated. As described earlier, the electrode (polysilicon electrode p-Si(s)) of the storage capacitor 1C, which is brought into conduction with the source s of the drive transistor 1B, and the electrode D1(s) of the auxiliary capacitor 1J, which is brought into conduct with the anode of the organic EL element 1D (that is, the source s of the drive transistor 1B), are provided in different wiring layers. However, it is desirable that the respective electrodes be brought into conduction with each other because the electrodes represent the same node.

Therefore, as shown in FIG. 20, a contact hole CH1 extending through the interlayer insulating films M1 and M2 is connected to the electrode D1(s) of the auxiliary capacitor 1J, and a contact hole CH2 extending through the interlayer insulating film M2 is connected to the electrode (polysilicon electrode p-Si(s)) of the storage capacitor 1C. The contact holes CH1 and CH2 are brought into conduction with each other using a second metal wiring D2.

A similar structure having an opposite connection relationship to the connection relationship between the electrodes of the storage capacitor 1C and the auxiliary capacitor 1J shown in FIG. 20 can be applied to the wiring relationship between the electrodes shown in FIG. 19C.

Driving Method

FIG. 11 is a timing waveform diagram illustrating a method for driving a display device according to the present embodiment. The timing waveform diagram shown in FIG. 11 is similar to the timing waveform diagram shown in FIG. 3 in that a light-emission period, threshold correction periods, and a sampling period & mobility correction period are repeated.

In the pixel layout (wiring structure) according to the present embodiment described above, although the storage capacitor 1C and the auxiliary capacitor 1J are adjacent to each other, a short is less likely to occur between the gate g of the drive transistor 1B and the cathode 1H of the organic EL element 1D, thus reducing the occurrence of a defective pixel. Therefore, the driving method described above is performed to prevent the occurrence of a defective pixel incapable of emitting light shown in FIG. 8 so that the potential of the video signal line DTL is not drawn to the cathode potential Vcath during the periods (F) to (J) shown in FIG. 8 or no pixels whose luminance increases are generated.

In the embodiment described above, the application to an organic EL display device including organic EL elements as electro-optical elements of the pixels 101 has been described by way of example. However, embodiments of the present invention are not limited to this application example, and can be applied to any display device including a current-driven electro-optical element (light-emitting element) whose light emission luminance changes in accordance with the current value of a current flowing in the device.

Furthermore, the pixels 101 each having a 2Tr/1C pixel configuration including two transistors (Tr) and one capacitor (C) by way of example. However, embodiments of the present invention are not limited thereto, and can also be applied to any other pixel configuration such as a 4Tr/1C pixel configuration including four transistors (Tr) and one capacitor (C).

The present application contains subject matter related to that disclosed in Japanese Priority Patent Applications JP 2008-315467 filed in the Japan Patent Office on Dec. 11, 2008 and 2008-316551 filed in the Japan Patent Office on Dec. 12, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising a pixel array unit having pixels arranged in a matrix, each pixel having a circuit configuration including an electro-optical element having a first electrode and a second electrode, a transistor, a first element, and a second element, wherein:
the first element has a first wiring and a second wiring overlapped with the first wiring partly,
the second element has a third wiring and a fourth wiring overlapped with the third wiring partly,
the first wiring and the third wiring are disposed in a first layer,
the second wiring and the fourth wiring are disposed in a second layer which is different from the first layer, the second wiring is connected to the third wiring via a fifth wiring in a third layer, the third layer being above the first layer and the second layer, and in cross section, the fifth wiring has a tapered shape and is thicker than each of the first wiring, the second wiring, the third wiring, and the fourth wiring.

2. The display device according to claim 1, further comprising:

a first insulating film between the first layer and the second layer, and a second insulating film between the second layer and the third layer, wherein:

the third wiring is connected to the fifth wiring via a first contact extending through the first insulating film and the second insulating film, and the second wiring is connected to the fifth wiring via a second contact extending through the second insulating film.

3. The display device according to claim 2, wherein the second wiring and the fourth wiring comprise polysilicon.

4. The display device according to claim 1, wherein:

the electro-optical element is an organic electroluminescent element, the first electrode is an anode, and the second electrode is a cathode.

5. The display device according to claim 1, wherein:

the first wiring is in electrical communication with a gate electrode of the transistor, and the fourth wiring is in electrical communication with the second electrode of the electro-optical element.

6. The display device according to claim 1, wherein:

the second wiring is in electrical communication with the source electrode of the transistor, and the third wiring is in electrical communication with the first electrode of the electro-optical element.

7. An electronic apparatus comprising a display device provided in a housing of the electronic apparatus, and a flexible printed circuit configured to input a video signal supplied to the electronic apparatus or generated in the electronic apparatus, the display device including:

a pixel array unit having pixels arranged in a matrix, each pixel having a circuit configuration including an electro-optical element having a first electrode and a second electrode, a transistor, a first element, and a second element, wherein, the first element has a first wiring and a second wiring overlapped with the first wiring partly, the second element has a third wiring and a fourth wiring overlapped with the third wiring partly, the first wiring and the third wiring are disposed in a first layer, the second wiring and the fourth wiring are disposed in a second layer which is different from the first layer, the second wiring is connected to the third wiring via a fifth wiring in a third layer, the third layer being above the first layer and the second layer, and in cross section, the fifth wiring has a tapered shape and is thicker than each of the first wiring, the second wiring, the third wiring, and the fourth wiring.

8. An electronic device comprising:

a display device including a pixel array unit having pixels arranged in a matrix, each pixel having a circuit configuration including an electro-optical element having a first electrode and a second electrode, a transistor, a first element, and a second element, wherein:

the first element has a first wiring and a second wiring overlapped with the first wiring partly, the second element has a third wiring and a fourth wiring overlapped with the third wiring partly, the first wiring and the third wiring are disposed in a first layer, the second wiring and the fourth wiring are disposed in a second layer which is different from the first layer, the second wiring is connected to the third wiring via a fifth wiring in a third layer, the third layer being above the first layer and the second layer, and in cross section, the fifth wiring has a tapered shape and is thicker than each of the first wiring, the second wiring, the third wiring, and the fourth wiring.

9. The electronic device of claim 8, wherein the electronic device is a mobile-phone.

10. The electronic device of claim 8, wherein the electronic device is a camera.

11. The electronic device of claim 8, wherein the electronic device is a portable computer.

12. The electronic device of claim 8, wherein the electronic device is a television.

13. A display device comprising a pixel array unit having pixels, each pixel including an organic electroluminescent element, a first element, and a second element, wherein, the first element has a first portion and a second portion overlapped with the first portion partly, the second element has a third portion and a fourth portion overlapped with the third portion partly, the first portion and the third portion are disposed in a first layer, the second portion and the fourth portion are disposed in a second layer which is different from the first layer, the second portion is connected to the third portion via a wiring in a third layer, the third layer being above the first layer and the second layer, and in cross section, the wiring has a tapered shape and is thicker than each of the first portion, the second portion, the third portion, and the fourth portion.

14. The display device according to claim 13, further comprising:

a first insulating film between the first layer and the second layer; and a second insulating film between the second layer and the third layer, wherein, the third portion is connected to the wiring via a first contact extending through the first insulating film and the second insulating film, and the second portion is connected to the wiring via a second contact extending through the second insulating film.

15. The display device according to claim 14, wherein the second portion and the fourth portion comprise polysilicon.

* * * * *